US009698594B2

(12) United States Patent
Coyne

(10) Patent No.: US 9,698,594 B2
(45) Date of Patent: Jul. 4, 2017

(54) OVERVOLTAGE PROTECTION DEVICE, AND A GALVANIC ISOLATOR IN COMBINATION WITH AN OVERVOLTAGE PROTECTION DEVICE

(71) Applicant: Analog Devices Global, Hamilton (BM)

(72) Inventor: Edward John Coyne, Athenry (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/937,771

(22) Filed: Nov. 10, 2015

(65) Prior Publication Data

US 2017/0133841 A1 May 11, 2017

(51) Int. Cl.
| | |
|---|---|
| H02H 9/04 | (2006.01) |
| H01L 27/02 | (2006.01) |
| H01L 27/06 | (2006.01) |
| H01L 29/808 | (2006.01) |
| H01L 23/58 | (2006.01) |

(52) U.S. Cl.
CPC ............. *H02H 9/046* (2013.01); *H01L 23/58* (2013.01); *H01L 27/0259* (2013.01); *H01L 27/0266* (2013.01); *H01L 27/0623* (2013.01); *H01L 29/8083* (2013.01)

(58) Field of Classification Search
CPC . H02H 9/046; H01L 27/0259; H01L 27/0623; H01L 23/58; H01L 29/8083; H01L 27/0266
USPC ........................................................ 257/265
See application file for complete search history.

(56) References Cited

U.S. PATENT DOCUMENTS

| | | | |
|---|---|---|---|
| 5,659,190 A | 8/1997 | Litwin | |
| 6,015,982 A | 1/2000 | Soderbarg | |
| 8,736,343 B2 | 5/2014 | Chen et al. | |
| 9,209,091 B1 * | 12/2015 | Harper | ................ H01L 27/1211 |
| 2003/0160281 A1 | 8/2003 | Chen | |
| 2005/0067630 A1 * | 3/2005 | Zhao | ................... H01L 29/8083 257/134 |
| 2011/0101417 A1 | 5/2011 | Ogura et al. | |
| 2015/0021682 A1 * | 1/2015 | Bobde | ................. H01L 29/7828 257/330 |

FOREIGN PATENT DOCUMENTS

| | | |
|---|---|---|
| EP | 2996246 | 3/2016 |
| WO | WO 01/061951 A1 | 8/2001 |

OTHER PUBLICATIONS

L. Vincent et al., "V-JFET Transistors for over voltage protection in power device series connected applications", Proceedings of the 18th International Symposium on Power Semiconductor Devices & IC's, Jun. 2006, 4 pgs.

Gillot, C., et al., "Wafer Level Thin Film Encapsulation for MEMS," 2005, 4 pages.

* cited by examiner

*Primary Examiner* — Fernando L Toledo
*Assistant Examiner* — Adam S Bowen
(74) *Attorney, Agent, or Firm* — Knobbe, Martens, Olson & Bear, LLP

(57) ABSTRACT

Components can be damaged if they are exposed to excess voltages. A device is disclosed herein which can be placed in series with a component and a node that may be exposed to high voltages. If the voltage becomes too high, the device can autonomously switch into a relatively high impedance state, thereby protecting the other components.

20 Claims, 20 Drawing Sheets

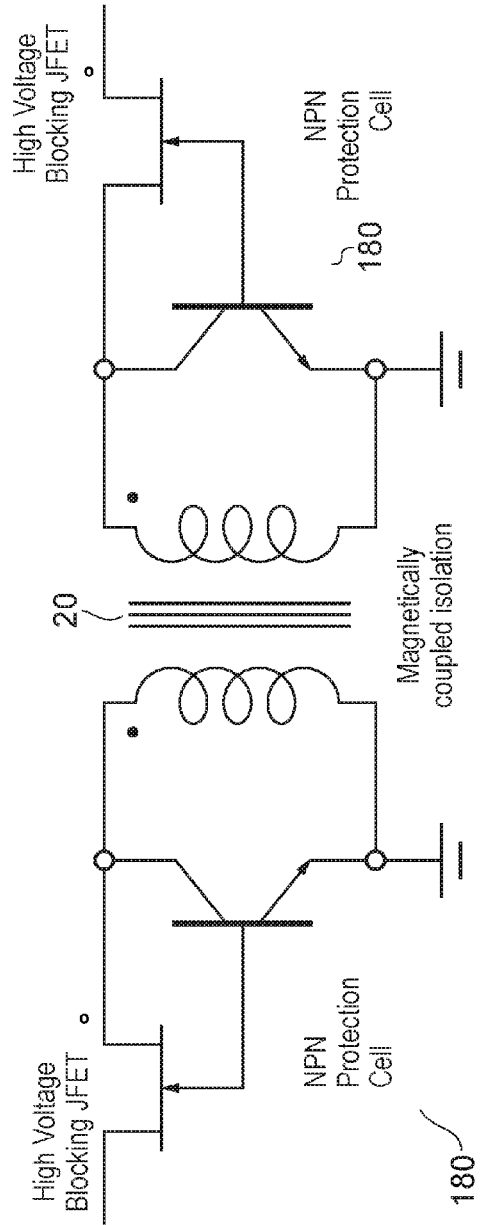
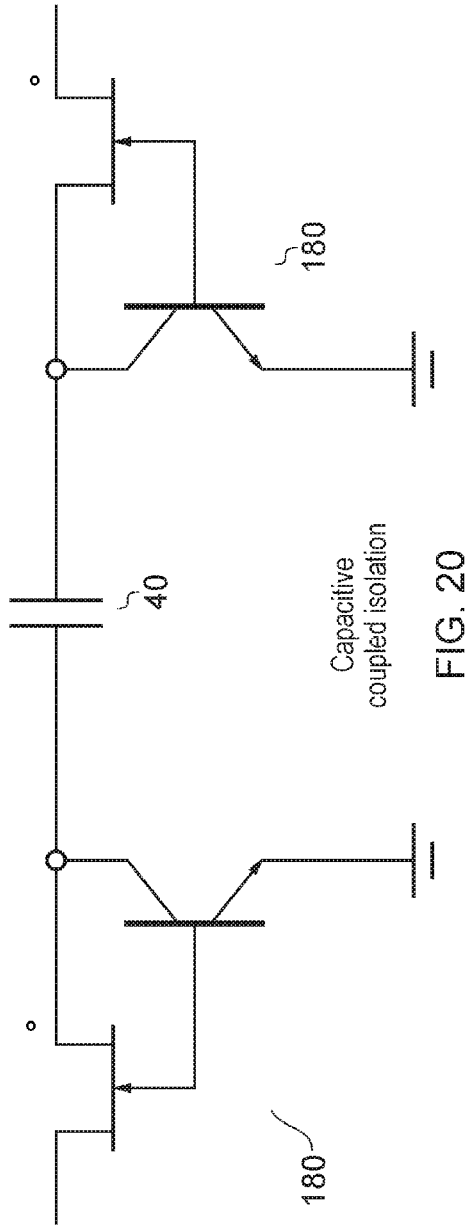
FIG. 19
FIG. 20

US 9,698,594 B2

OVERVOLTAGE PROTECTION DEVICE, AND A GALVANIC ISOLATOR IN COMBINATION WITH AN OVERVOLTAGE PROTECTION DEVICE

FIELD

The present disclosure relates to semiconductor based overvoltage protection devices, and to galvanic isolators, as may be used in data transmission schemes, that can be associated with such overvoltage protection devices. This disclosure also relates to integrated circuits including semiconductor based over voltage protection devices.

BACKGROUND

There are many areas of electronics where it is desired to propagate signals, either analog or digital signals, from one voltage domain to another voltage domain. Examples of such systems include power monitoring or motor control where the voltages in a first voltage domain can range up to 1200 volts or more referenced to a first reference voltage, whereas the control electronics may need to interface with other systems, and is typically in a voltage domain of only a view volts, for example 5 volts, referenced to a second reference voltage, typically ground. Such an arrangement is shown in FIG. 1 where the voltages in the first voltage domain ($V_{DOM1}$) extend between voltage V1 and voltage $V_{REF1}$, and where the voltages in the second voltage domain ($V_{DOM2}$) extend between voltage V2 and $V_{REF2}$. Transmission of signals between these first and second voltage domains is typically done by way of an isolator 10. The isolator 10 may provide galvanic isolation between the two voltage domains. Isolators may include opto-electric couplers, but other technologies are possible, for example capacitors 12, as shown in FIG. 2, or transformers 14, as shown in FIG. 3. Typically, capacitive and transformer based isolation may be preferable and can be provided in chip scale packages (e.g., an integrated circuit form). For example, the capacitive and transformer isolation may be provided in monolithic integration or as two or more dies within a chip scale package (integrated circuit package).

Such isolators can be exposed to the full voltage difference between the first and second voltage domains $V_{DOM1}$ and $V_{DOM2}$. In some circumstances, these voltage domains might be subject to transient over voltages, such that either the isolator has to be significantly over specified in terms of its maximum voltage, possibly with an impairment in its ability to transmit data, or otherwise there may be a risk of the device becoming damaged. Furthermore, in the case of transformer based isolators, it may also be desirable to avoid the voltage, acting within a coil, from becoming too great, which may create additional electrical stresses leading to failure of the transmission path within the isolator even if the isolation between the two voltage domains does not fail. For example, in transformers formed in integrated circuits excess voltage at a node of the transformer might cause excess current flow that could damage the transformer.

SUMMARY

According to a first aspect of the present disclosure, there is provided a protection device arranged to inhibit current flow between a first node and a second node when a potential difference between the first node and a control node exceeds a predetermined value, the protection device comprising a vertically formed field effect transistor comprising a semiconductor material doped to form a first type of semiconductor in current flow communication between the first and second nodes, and a restrictive structure arranged to limit a spatial extent of a conducting channel of the first type of semiconductor, where the restrictive structure is connected to the control node and the restrictive structure comprises a second type of semiconductor positioned away from the surface of the device.

One non-limiting advantage of the protection device disclosed herein is that the protection device may be provided in combination with and, at least part of the protection device is on the same substrate as, a galvanic isolator.

In some implementations, the protection device is in the form of a junction field effect transistor. In one embodiment, the junction field effect transistor operates as a depletion mode device, such that the junction field effect transistor is conducting when the voltage at its control node is similar to the voltage within a channel region of the protection device. In this context, "similar" can be defined to mean within less than a predetermined threshold of difference.

As the voltage at the first node of the protection device rises, the channel voltage also may change such that the channel between the first and second nodes becomes progressively narrowed until eventually it is pinched off to inhibit current flow between the first and second nodes. Accordingly, the protection device limits the voltage that can occur at the galvanic isolator, or other components or circuits connected to the protection device.

One non-limiting advantage of the protection device disclosed herein is that the protection device may further comprise an integrated controllable current flow path between the second node and either the control node or a another node, where the integrated current flow path operates as a high impedance path when the first and second nodes are in current flow communication with each other, for example, when the difference between the channel voltage and the control voltage is below the predetermined threshold, and the current flow path between the second node and the control node or the another node becomes conducting or low impedance when the first and second current flow nodes are not in current flow communication, for example when the predetermined voltage difference is exceeded.

The protective device may also be provided in series with input and output terminals/pins/nodes of a variety of integrated circuits in order to protect components of the integrated circuit from overvoltage or under-voltage events

BRIEF DESCRIPTION OF THE DRAWINGS

Embodiments of the present disclosure will now be described, by way of non-limiting example only, with reference to the accompanying figures, in which:

FIG. 19 shows an example arrangement in which devices of the type shown in FIG. 16 provides symmetric overvoltage protection to a transformer based isolator;

FIG. 20 shows an example arrangement in which devices of the type shown in FIG. 16 are arranged to provide symmetric overvoltage protection to a capacitive isolator;

FIG. 21b shows the equivalent positions of components within the structure shown in FIG. 21a;

DETAILED DESCRIPTION OF CERTAIN EMBODIMENTS

Figure 1:
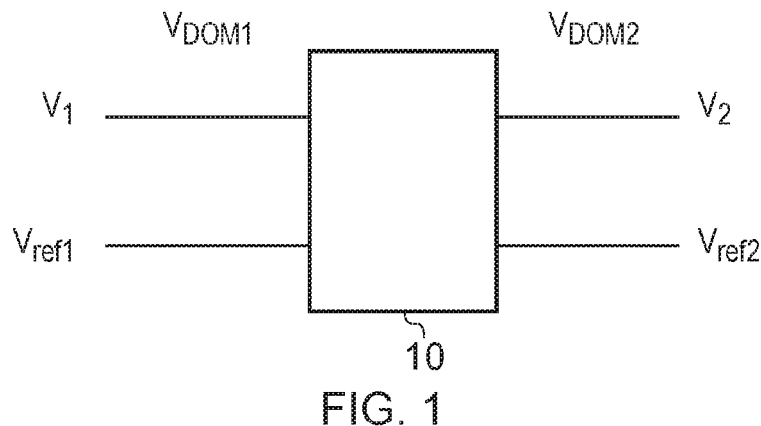
FIG. 1 schematically illustrates a galvanic isolator acting to allow signal propagation between a first voltage domain and a second voltage domain.
Figure 2:
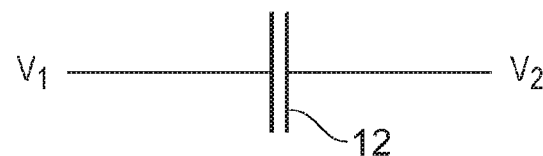
FIG. 2 schematically illustrates a capacitive voltage isolator.
Figure 3:
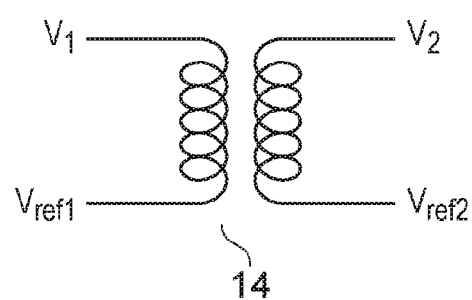
FIG. 3 schematically illustrates a transformer based isolator.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Embodiments of the present disclosure will be described with reference to the accompanying drawings, with an orientation of the embodiments as shown in the drawings. Thus, in the drawings an uppermost surface of the device is shown as being horizontal and the channel is vertical, and these terms are used in the description in relation to devices as orientated as shown in the drawings. Additionally, where semiconductor regions are separated from one another, the separation is shown as a boundary line, although it should be understood that in actual devices the boundaries may be less distinct.

Figure 4:
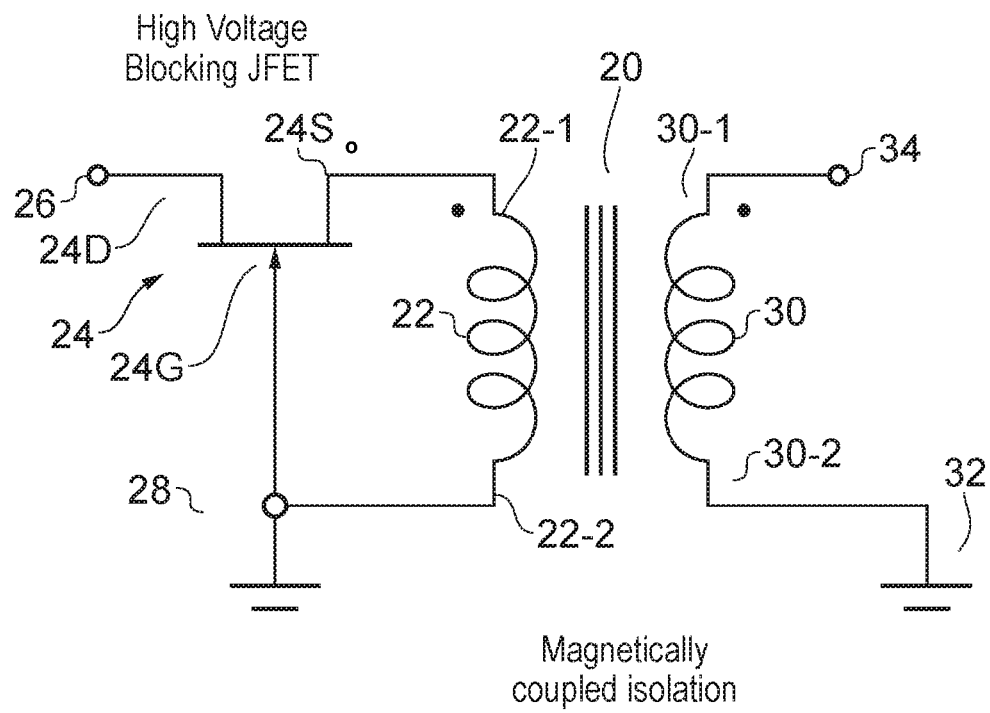
FIG. 4 schematically illustrates an asymmetric protection circuit including a protection device in the form of a high voltage blocking JFET, constituting an embodiment to the present disclosure, is provided in association with a coil of a magnetically coupled isolator.
Figure 5:
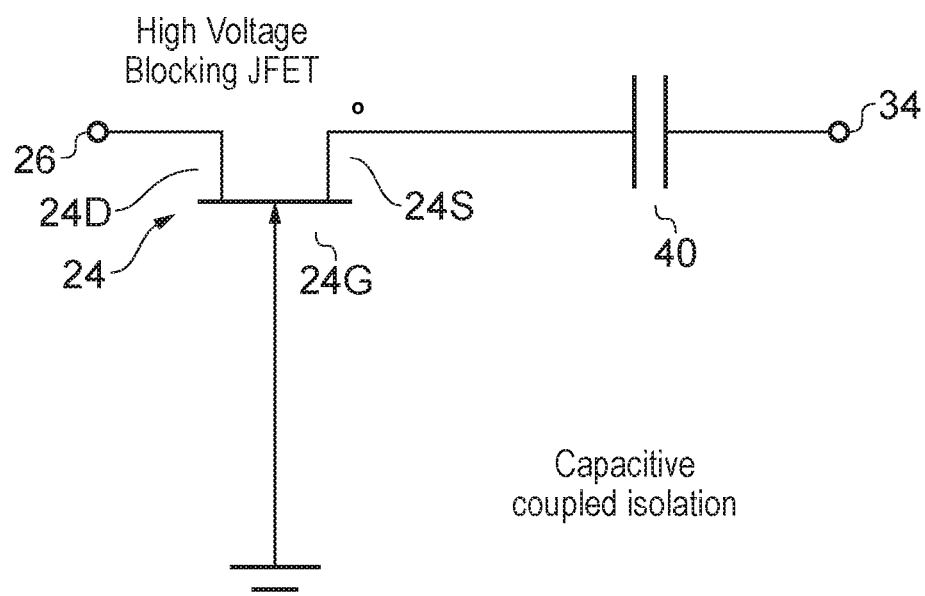
FIG. 5 schematically illustrates an asymmetric protection circuit in which a high voltage blocking JFET, in accordance with the present disclosure, is connected to a terminal of a capacitively coupled isolator.

FIG. 4 schematically illustrates a transformer based galvanic isolator 20 where a first winding 22 of the transformer is provided is series with a high voltage blocking junction field-effect transistor (JFET) 24 formed in accordance with the present disclosure. A drain contact 24D of the JFET 24 is connected to a high voltage node 26 of the first voltage domain, and a source contact 24S of the JFET 24 is connected to a first terminal 22-1 of the first winding 22. A gate 24G of the JFET 24 is connected to a second terminal 22-2 of the first winding 22 and to a local ground 28, equivalent to a first reference voltage ($V_{REF1}$) of FIG. 1. The first and second winding 22 and 30 may utilize magnetically coupled isolation. A second winding 30 of the transformer based isolator 20 may have one end 30-2 of its winding connected to a second local ground 32, equivalent to a second reference voltage ($V_{REF2}$), within the second voltage domain, and the other end 30-1 of the winding 30 is connected to a node 34. Either of nodes 26 and 34 may be connected to a signal transmission circuit (not shown) and the other of nodes 26 and 34 may be connected to a signal reception circuit. An example of such circuits is described in EP1171980, the entirety of the disclosure of which is incorporated by reference herein. The signal transmission circuit may receive an incoming signal, which may be a digital signal or an analog signal, and process it in a way so that the signal is suitable for transmission across the transformer based isolator 20. Such circuits, in the context of digital signals, include encoding rising and falling edges of digital pulses, either in terms of pulse width or in terms of pulse count, such that a receiver can decode the pulses and reconstruct the original digital signal. Information may also be transmitted by modulating a signal to represent "1" and not modulating it to represent "0" or by transmitting signals at different frequencies to represent "1" and "0", respectively. Both a receiver and transmitter (not shown) may be connected to each of the nodes 26 and 34 for bidirectional communication across the isolator 20. FIG. 5 shows a similar arrangement, but where the transformer based isolator 20 has been replaced by a capacitor 40 based galvanic isolator that may provide for capacitive coupled isolation.

Figure 6:
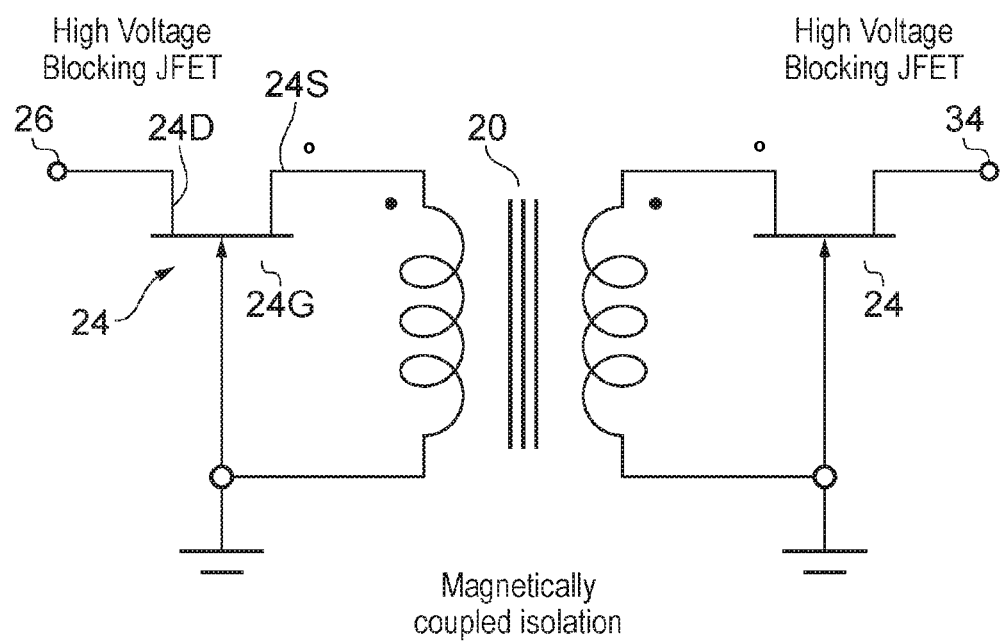
FIG. 6 schematically illustrates a circuit diagram of a symmetric isolation device in which high voltage blocking JFETs, in accordance with the teachings of the present disclosure, are provided on both primary and secondary windings of a magnetically coupled isolator.
Figure 7:
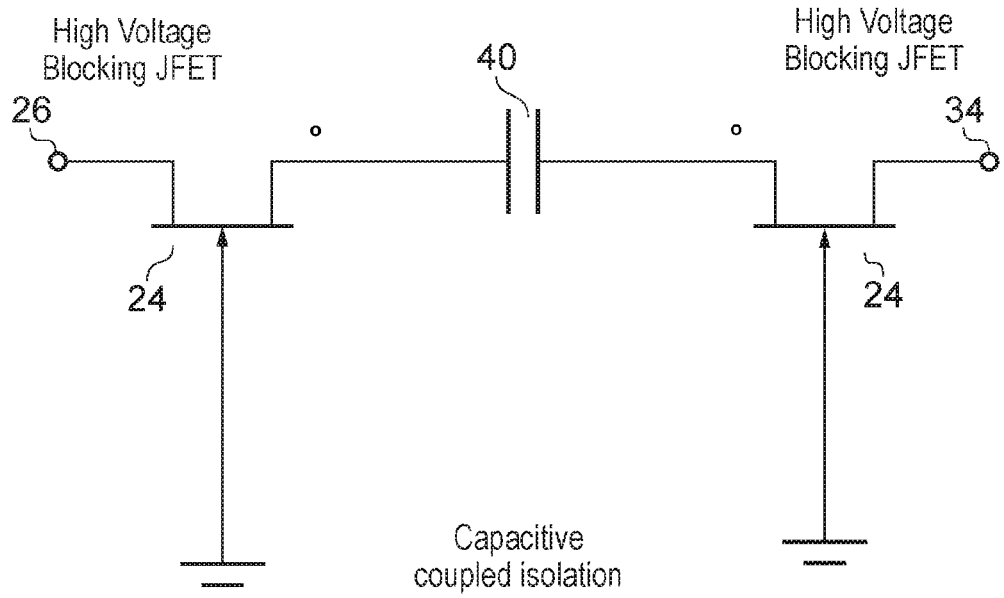
FIG. 7 schematically illustrates a circuit diagram of a symmetric protection device in which high voltage blocking JFETs, in accordance with the teachings of the present disclosure, are provided in association with the first and second terminals of a capacitive isolation barrier.

FIG. 6 and FIG. 7 are similar conceptually to FIG. 4 and FIG. 5, but the high voltage blocking JFETs are provided on both sides of the galvanic isolator 20, be that a transformer or capacitor 40, respectively.

Figure 8:
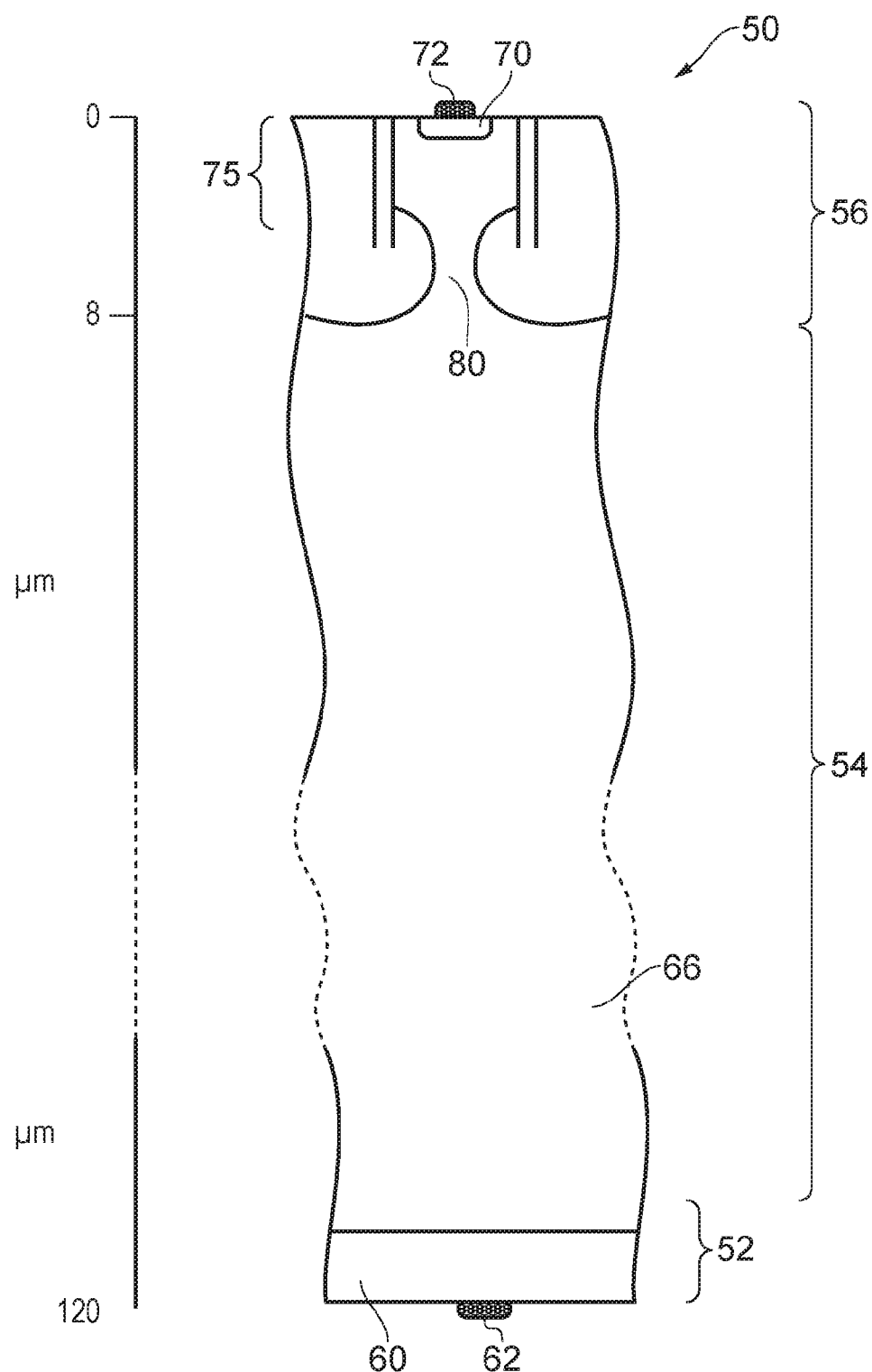
FIG. 8 is a schematic cross-section through part of a protection device in accordance with the teachings of the present disclosure.

FIG. 8 is a cross section of an embodiment of a protection device 50, illustrated as a vertically formed JFET structure, in accordance with the teachings of this disclosure. FIG. 8 includes a numerical scale ranging from zero to 120 microns, however it will be understood that the elements illustrated in FIG. 8 are not necessarily drawn to scale and the numerical scale is shown for illustrative purposes only. The protection device 50 can broadly be regarded as comprising three N doped regions within the semiconductor 66 substrate in which the device 50 is formed. A first region 52 forms the drain of the protection device 50, which may be based on a JFET. Accordingly, terminology appropriate to JFETs will be used herein. A second region, generally designated 54, forms a spatially extensive voltage dropping region, which can be regarded as an extended drain region. The third region 56 can be regarded as an active portion of the device, because the third region 56 can control current flow.

The first region 52 comprises a handle wafer 60. The handle wafer 60 may be highly N doped, with doping concentration of around $10^{19}$ donors per cubic centimeter. A metallic contact 62 can be formed on part of the handle wafer 60 to provide current flow communication with the drain of the protection device 50.

The semiconductor 66 in second region 54 is less doped than the handle wafer 60, but is doped to be the same semiconductor type as handle wafer 60. In the example illustrated in FIG. 8, second region 54 is an N type region, which can be formed as an epitaxial layer with a doping concentration of around $10^{14}$ donors per centimeter cubed. This lesser doped epitaxial silicon layer of semiconductor 66, which forms the extended drain region, can have its depth tailored, as appropriate, to allow the protection device 50 to withstand a design voltage. In general, making the depth of semiconductor 66 deeper allows the protection device 50 to withstand a greater operating voltage or to withstand a larger overvoltage. However, having a deeper semiconductor 66 may also increase the carrier transit time across the semiconductor 66 and the responsiveness of the protection device 50, in terms of its switching time, may decrease with increasing depth of the N type epitaxial silicon layer of the illustrated semiconductor 66.

As can be seen from FIG. 8, the protection device 50 may be relatively thick, with the second region 54, in some embodiments, being approximately 110 microns thick. Other dimensions are possible without varying the principles and advantages of the embodiments of the protection devices disclosed herein. Wafers of this thickness and comprising the first and second regions 52 and 54 with the appropriate depths are commercially available, because they may represent a starting point for insulated gate bipolar transistor devices.

The third region 56 comprises a highly N type doped source region 70 in contact with a metallic contact 72 such that current can be introduced to the protection device 50 and flow between its drain and source contacts 62 and 72 respectively. The source region 70 may be surrounded by a restrictive structure, generally designated as restrictive structure 75. Restrictive structure 75 may act to inhibit movement of the carriers laterally of the source region 70, and force current flow and carrier movement in the vicinity of the source region 70 to be vertical. The restrictive structure 75 may act to define a vertically extending channel, generally designated as channel 80. The formation of the restrictive structure 75 that defines the channel 80 will be discussed in greater detail with FIGS. 9, 10 and 11. In some embodiments, the third region 56 may be approximately 8 microns thick. Other dimensions are possible without varying the principles and advantages of the embodiments of the protection devices disclosed herein.

Figure 9:
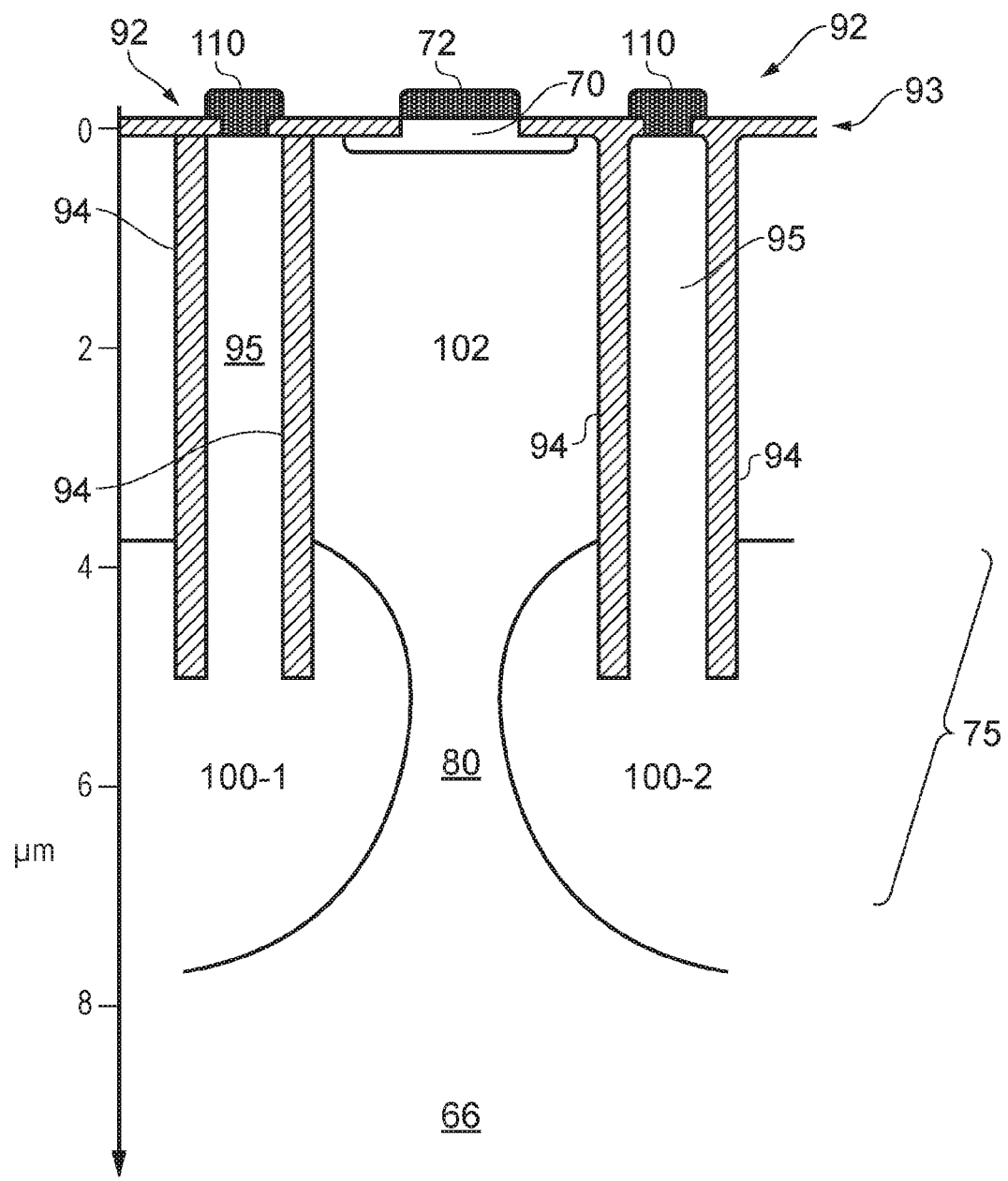
FIG. 9 shows an upper portion of the device of FIG. 8 in a greater detail.

FIG. 9 shows the third region 56 of the protection device 50 shown in FIG. 8 in greater detail. FIG. 9 includes a numerical scale ranging from zero to 8 microns, however it will be understood that the elements illustrated in FIG. 9 are not necessarily drawn to scale and the numerical scale is shown for illustrative purposes only. In this embodiment the restrictive structure 75 can be regarded as performing at least two roles. A first role is to define a width of the channel 80, and a second role is to define the extent of a plug 102 of N type material that connects the channel 80 to the source region 70. In the embodiment illustrated in FIG. 9, the restrictive structure 75 comprises multiple insulated conducting channels 92 formed either side of the source region 70 and extending downwardly for several microns. In one embodiment, insulated conducting channels 92 may extend between approximately four and approximately six microns. Other dimensions are possible without varying the principles and advantages of the embodiments of the protection devices disclosed herein. In this example, each insulated conducting channel 92 may be formed by etching a trench from the upper surface 93 of the protection device 50 and then lining the sides of the trench with a dielectric material, such as a thermal oxide, to form insulating walls 94. The insulating walls 94 can comprise any suitable dielectric material. The insulated conducting channels 92 may be open at the bottom and in contact with first and second P doped regions 100-1 and 100-2 which delimit the spatial extent of the channel region 80 of N type material. The channel 80 may open back into region 102 of N type material bounded by the insulated conducting channels 92. The regions between the insulating walls 94 can be filled with conductive material 95, for example a P type semiconductor such that the regions 100-1 and 100-2 can form a buried JFET gate in contact with gate electrodes 110.

In some embodiments, the structure can be formed by changing the doping of the epitaxial layer of semiconductor 66 as it is grown from N type to P type in the region. In one embodiment, where the channel region 80 and P doped regions 100-1 and 100-2 are provided, the doping of the epitaxial layer of semiconductor 66 corresponds to a depth of approximately 8 microns to approximately 4 microns from the top of the finished protection device 50. Other dimensions are possible without varying the principles and advantages of the embodiments of the protection devices disclosed herein. In another embodiment, where the starting wafer comprises first and second regions 52 and 54 of appropriate depth, P type material may be implanted into selected regions at the top of the wafer or P type material may be grown over the surface of the wafer. The region which corresponds to the channel 80 can then be N type doped in order to reestablish an N type column between the regions 100-1 and 100-2. The mask used to permit reestablishing regions 100-1 and 100-2 can then be removed and the remainder of the protection device 50 can be epitaxially grown so as to form the N type region 102 extending to the surface. Region 102 can be regarded as being a plug of semiconducting material. Once the restrictive structure 75 has been formed then further processing steps can be performed to form the source region 70 and the trenches and thermal oxide in order to create the insulated channels 92.

Depletion region boundaries can be formed around the interface between the N type channel region 80 and the P type regions 100-1 and 100-2 that form part of the restrictive structure 75, which may restrict the spatial extent of the channel 80 and restrict the carriers to flow along a path vertically aligned with the source region 70 and between the walls 94 of dielectric material. The width of the depletion regions may be modulated by the voltage difference between the channel 80 and the regions 100-1 and 100-2. As the voltage difference increases, the depleted regions around the P type regions 100-1 and 100-2 can grow towards each other until they intersect, thereby pinching off the channel 80 and inhibiting current flow. The voltage at which the channel region 80 becomes pinched off can be set by the relative positions of the edges of the regions 100-1 and 100-2 with respect to each other, and optionally by the doping concentrations of the regions 100-1 and 100-2 and/or the N type material that forms the channel 80. In some embodiments, as shown in FIG. 9, insulating layers (not shown) form passivation over the upper surface 93 of the protection device 50, the insulating layers having apertures formed therein such that contacts 72 and 110 can be made to the source region 70 of the protection device 50 and to the conductive material within the insulated channels 80.

Figure 10:
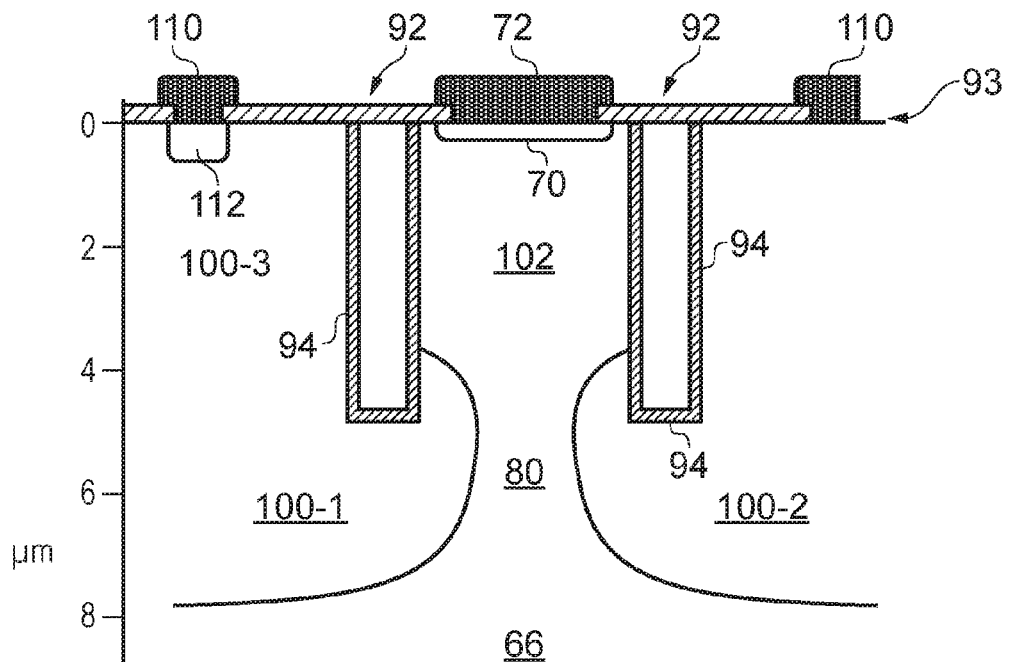
FIG. 10 schematically illustrates an alternative configuration of an uppermost portion of a device in accordance with the teachings of the present disclosure.

In another embodiment shown in FIG. 10, the ends of the trenches used the form the insulated conducting channels 92 might also be closed by the insulating walls 94 and the P type material 100 may extend up to the upper surface 93 of the protection device 50 to form region 100-3 in those portions of the device positioned away from the source region 70. The gate contact 110 may make contact with the region 100-3 and hence regions 100-1 and 100-2 by way of a doped P type region 112 that is more highly doped relative to the regions 100-3. Thus, the regions 100-1 and 100-2, in conjunction with the insulating walls 94, form the restrictive structure 75 around the source of the protection device 50, and the insulated conducting channel 92 is disposed away from the surface of the protection device 50, by several microns. A further variation is to etch trenches around the plug 102. FIG. 10 includes a numerical scale ranging from zero to 8 microns, however it will be understood that the elements illustrated in FIG. 10 are not necessarily drawn to scale and the numerical scale is shown for illustrative purposes only. Other dimensions are possible without varying the principles and advantages of the embodiments of the protection devices disclosed herein.

Figure 11:
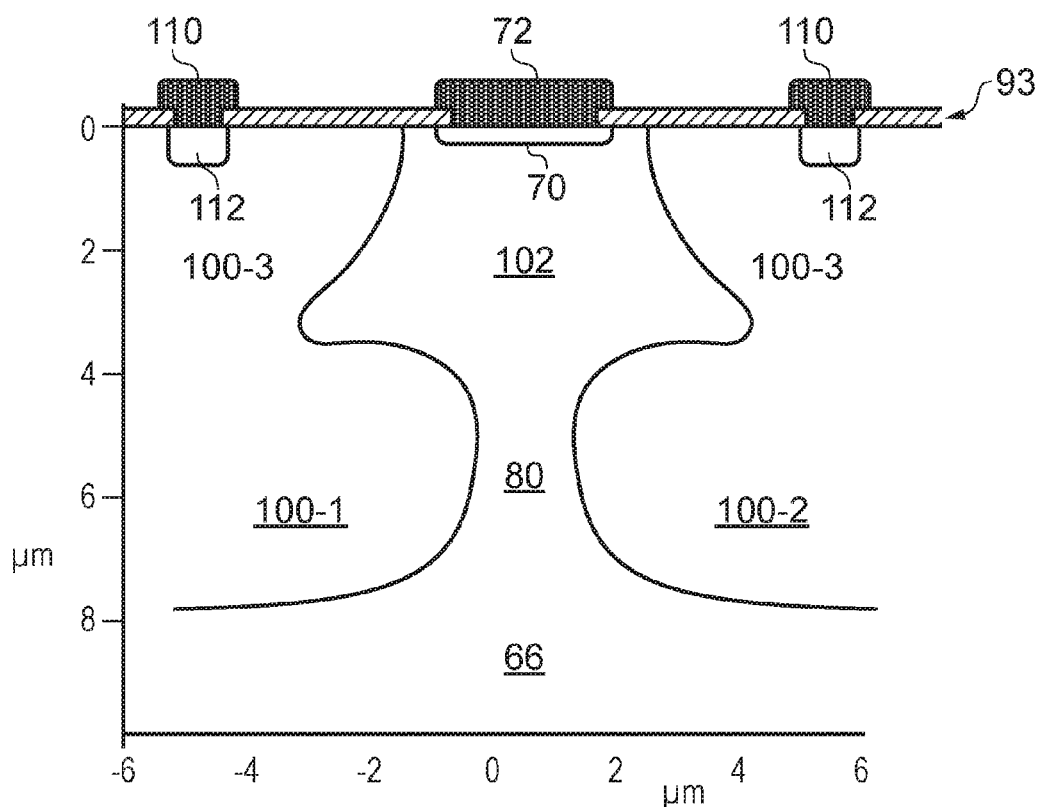
FIG. 11 shows a further embodiment of an uppermost portion of a device in accordance with the teachings of the present disclosure.

FIG. 11 shows a further variation in which the P type doping acts to form the restrictive structure 75 alone and the third region 100-3 of P type doped semiconductor surrounds or encircles the N type plug 102. In the embodiment illustrated in FIG. 11, during manufacture, the N type epitaxial layer is grown from the N type handle up to a distance of approximately 8 microns from what will be the eventual upper surface 93 of the protection device 50. Other dimensions are possible without varying the principles and advantages of the embodiments of the protection devices disclosed herein. Then a P type layer is grown for approximately 4 microns or so, and then patterned both to allow selective implant of the N type material to form the channel 80. Then P type material is deposited for approximately a further 4 microns up to the upper surface 93 of the protection device 50, and then further N type implants are performed in order to form the region of enhanced width 102 compared to the width of channel region 80 and then to form the source region 70 that engages with the source contact 72. FIG. 11 includes numerical scales ranging from zero to 8 microns and negative six to six microns, however it will be understood that the elements illustrated in FIG. 11 are not necessarily drawn to scale and the numerical scale is shown for illustrative purposes only. The source contact 72 may be formed of a metal conductor selected to provide the sought after functionality. As before, the N type region 102 is above and is wider than the channel region 80, and can still be regarded as a being a plug of N type semiconductor.

Although three variations for the third region 56 of FIG. 8 have been disclosed, it can be seen that they all seek to form a narrow JFET channel disposed vertically within the protection device 50, and away from the surface 93, with carrier flow that is perpendicular to the surface 93 of the protection device 50. Any of the principles and advantages discussed herein can be applied to any suitably shaped device configuration.

Figure 12:
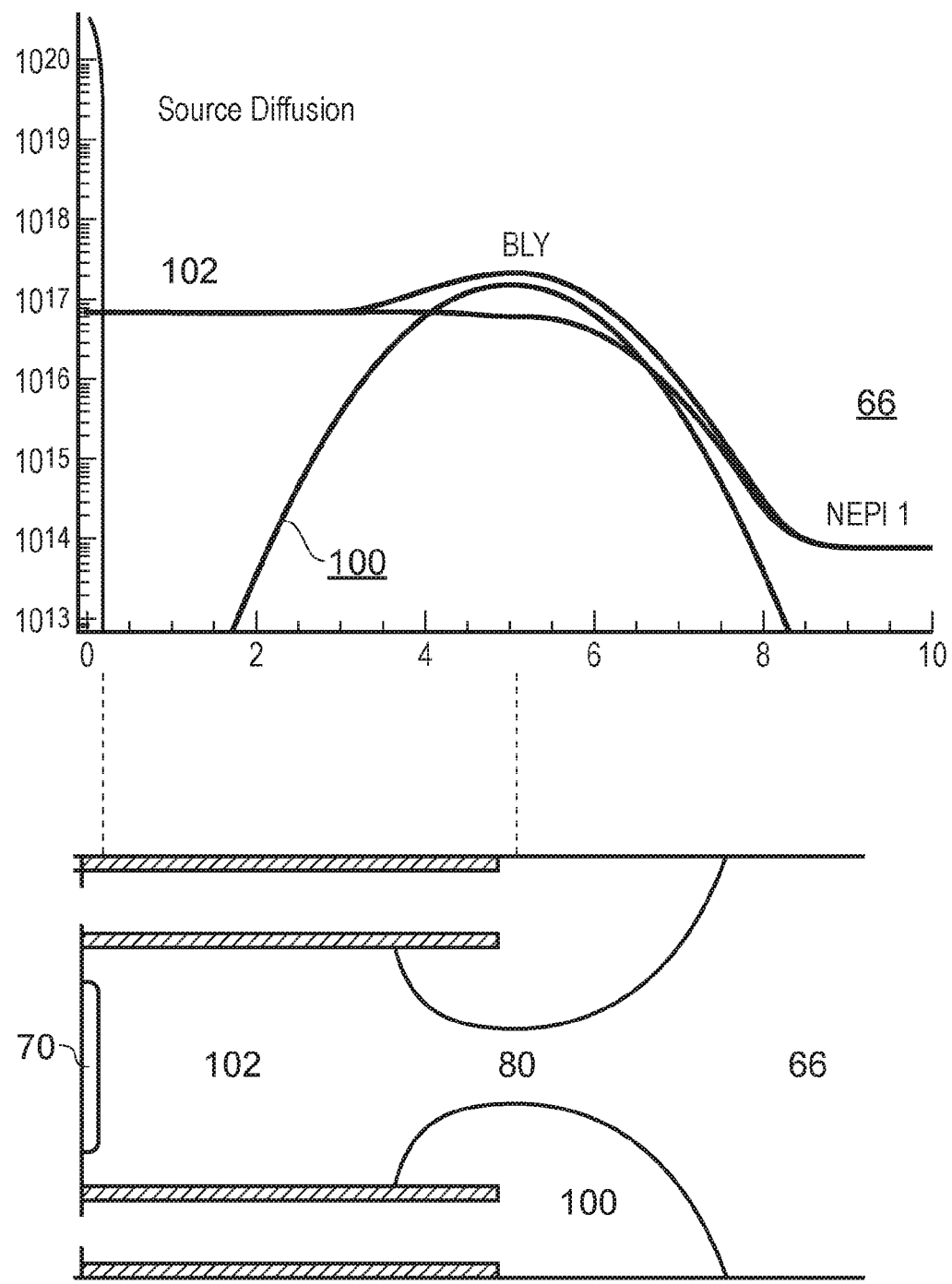
FIG. 12 schematically illustrates various doping concentrations as a function of position within the device shown in FIG. 9.

FIG. 12 illustrates the relative doping densities of the protection device 50 discussed with respect to FIG. 10. Thus, within the channel region 80 of the device, e.g., directly below the source region 70, the P type doping used to form the regions 100-1 and 100-2 is provided as a graded profile, as indicated with reference to numeral 100 on FIG. 12. In some embodiments, the graded profile includes acceptor impurity concentrations ranging from about $10^{13}$ cm$^{-3}$ at a depth of approximately 1.9 and approximately 8.1 microns, rising to approximately $2 \times 10^{17}$ at a depth of approximately 5 microns. Meanwhile the N type doping can be seen to be relatively highly doped in the source region 70, at around $10^{20}$ donors per centimeter cubed, and then being reduced to around $7 \times 10^{16}$ donors per centimeter cubed in the region 102 extending for several microns beneath the source region 70. The N type doping in the source region may also potentially be varied either upwardly or downwardly by about 50% to match with the center of the channel region 80 depending on the desired pinch off voltage, and then decreasing to approximately $2 \times 10^{14}$ donors per centimeter cubed throughout the bulk of the epitaxial region layer of semiconductor 66 forming the extended drain region. These dopings are shown in association with the device structure in FIG. 12, which may be similar to the protection device of FIG. 10.

Figure 13:
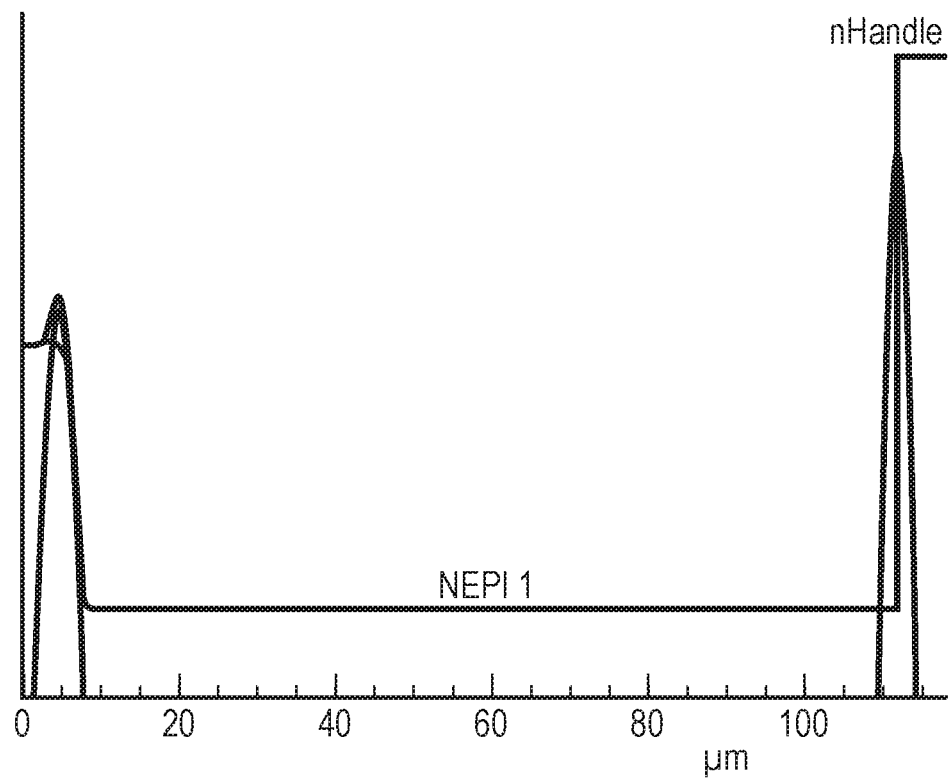
FIG. 13 shows example doping concentrations within an embodiment of the of a device in accordance with the teachings of the present disclosure.
Figure 13:
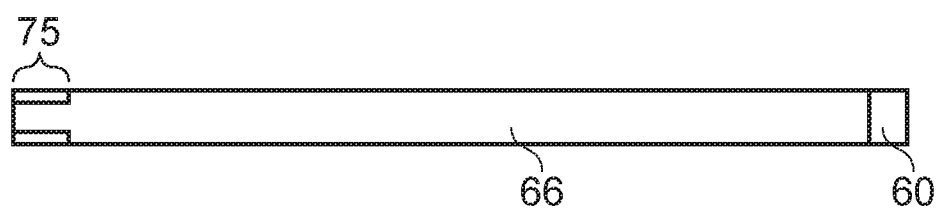

FIG. 13 shows the approximate doping concentrations for the protection device 50 as a whole. FIG. 13 also shows that throughout the depth of the protection device 50, from approximately 8 or 9 microns to about 110 microns deep the doping concentration for the epitaxially grown region of semiconductor 66 remains substantially constant before the concentration rises relatively steeply at the P type handle wafer 60.

As described above with reference to FIG. 9-11, the structure of a JFET, in accordance with embodiments of a protection device 50 disclosed herein, is such that the channel region 80 pinches off once the voltage difference becomes reversed biased by a sufficient voltage. Accordingly, the remainder of the voltage across the protection device 50 is dropped over the extended semiconductor 66. A further non-limiting advantage of the protection devices disclosed herein is that a relatively modest gate current flows (e.g., pico-amperes to nano-amperes), which may help to hold the potential of the regions 100-1 and 100-2 fixed.

Figure 14:
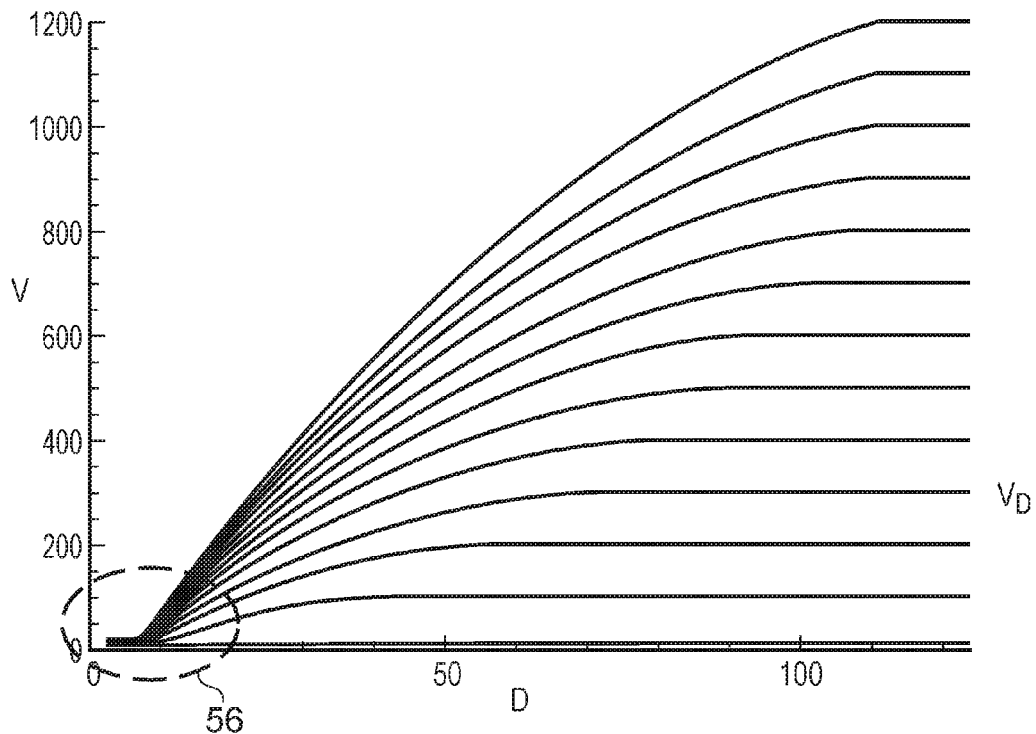
FIG. 14 shows a plot of voltage at various positions within the device of FIG. 9 as a function of the voltage applied to a drain terminal of the device.
Figure 15:
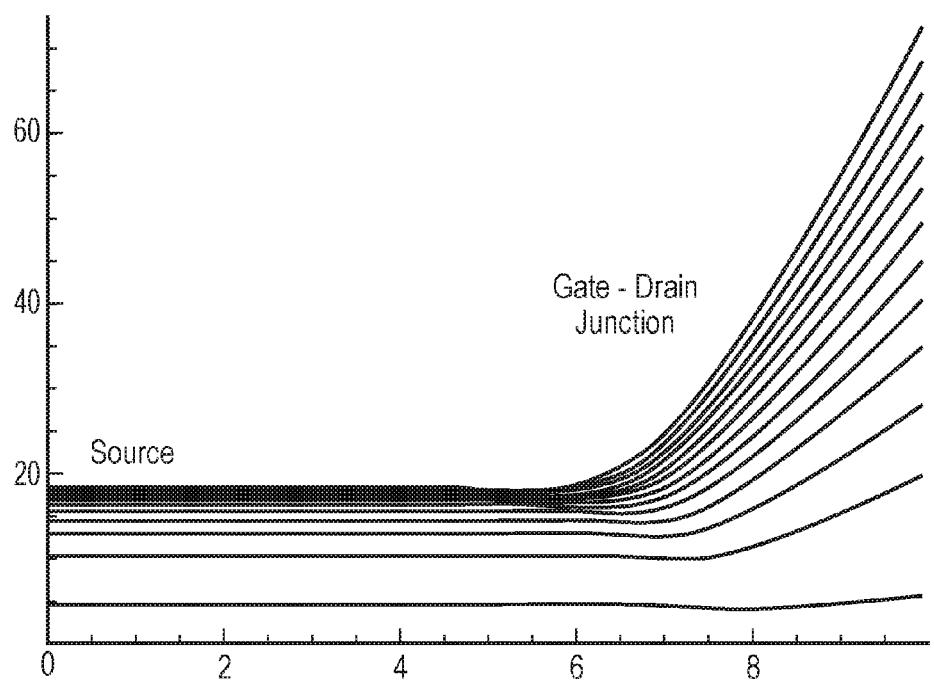
FIG. 15 shows a portion of FIG. 14 in greater detail.

FIG. 14 is a series of graphs showing the potential, expressed in Volts, within the body of the protection device 50 and measured as a function of distance in microns from the upper surface 93 of the protection device 50 towards the drain region or handle wafer 60. The graphs illustrated in FIG. 14 are shown through a series of drain voltages ($V_D$) between about 100 and about 1200 volts. In each case, the voltage within the protection device 50 is dropped over a relatively extensive area, such that the electrostatic field strength within the silicon always remains within tolerable limits. FIG. 14 also shows that near the third region 56 the evolution of voltage with respect to distance changes, and becomes held substantially constant to a predetermined maximum value (e.g., around 18 volts) between a distance of about 6 microns deep and the upper surface 93 of the protection device 50. FIG. 15 illustrates this aspect of the voltage potential in greater detail. This is, at least in part, attributable to the action of the pinched off protection device 50.

The embodiments of protection devices discussed thus far with respect to FIG. 9-15 have been autonomous. In operation, the protection devices cease conducting once the voltage between the channel region 80 and its gate electrode exceeds a predetermined value. Another non-limiting advantage is that this feature is also a failsafe, for example, because no external signal is required to control the protection devices to switch between low impedance and high impedance states.

Figure 16:
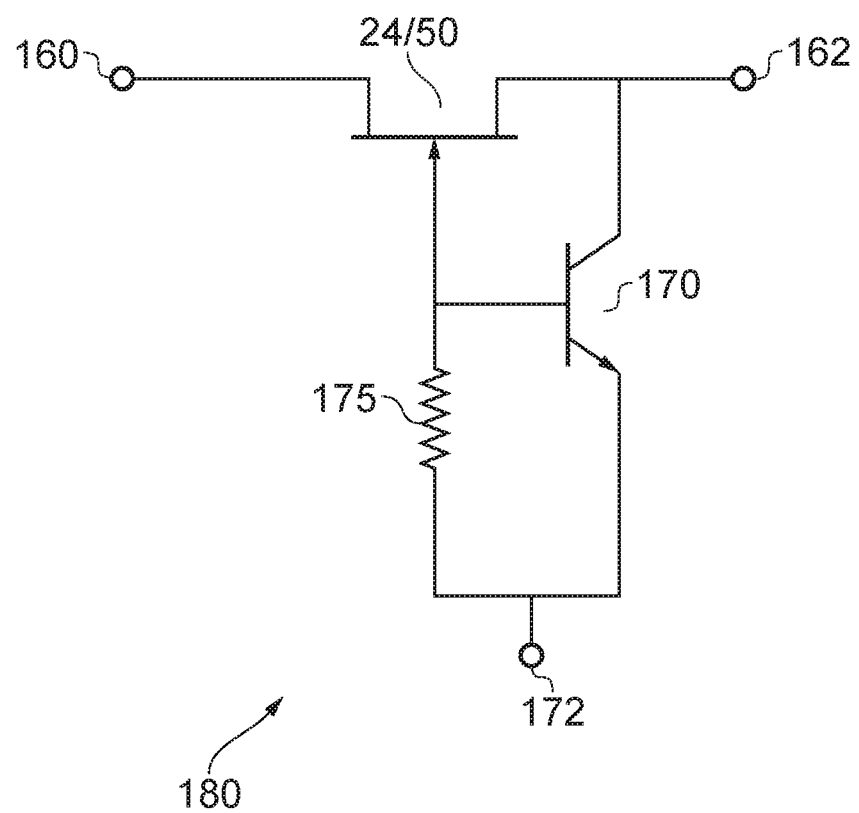
FIG. 16 is an equivalent circuit diagram of a further embodiment of the protection device in accordance with the teachings of this disclosure.
Figure 17:
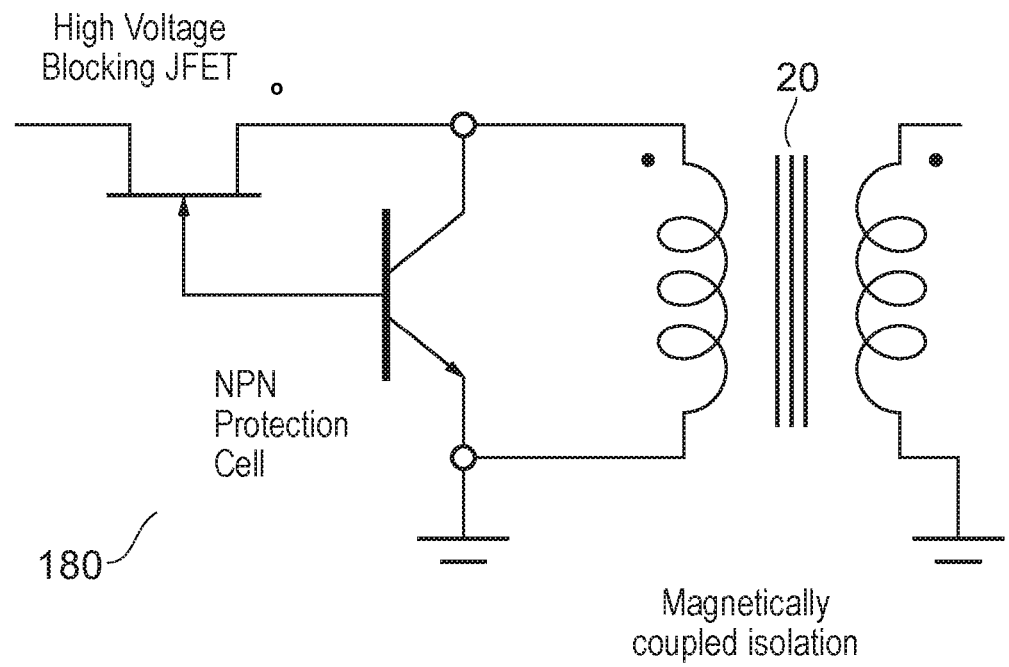
FIG. 17 schematically illustrates the device of FIG. 16 arranged to provide asymmetric protection to a magnetic isolator.
Figure 18:
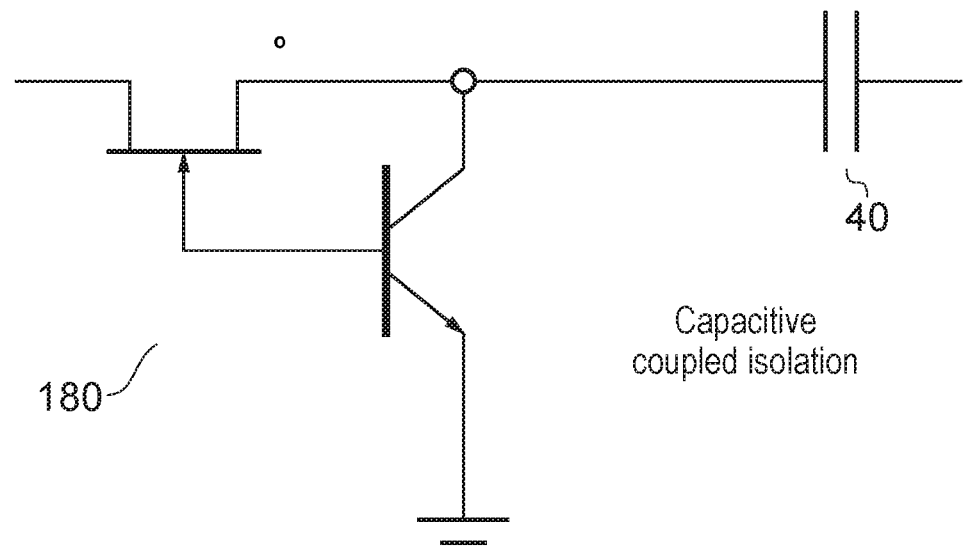
FIG. 18 schematically illustrates the device of FIG. 16 arranged to provide asymmetric protection to a capacitor based isolator.

FIG. 16 is a circuit diagram illustrating a further embodiment of a protective device 180 having a high voltage JFET 24 connected between nodes 160 and 162. The protective device 180 may acts, substantially similar to the protection device 50 of FIG. 9-15, to inhibit current flow between nodes 160 and 162 once the voltage in the channel of the JFET 24 (or 50 when referring to FIG. 8) exceeds a gate voltage by a predetermined amount. In the variation of FIG. 16, the JFET 24 is provided in conjunction with a bipolar transistor 170. The bipolar transistor 170 can be turned on by the gate current flowing through the JFET transistor 24 when the JFET 24 becomes pinched off to provide a current flow path between node 162 and a further node connected to the emitter of JFET 24 or, as shown in FIG. 16, to the control node 172 which is held at a local ground voltage. This combination of the high voltage blocking JFET 24 and bipolar transistor 170 is generally designated protective device 180 in FIG. 16 and which may be substituted into the asymmetric or symmetric protection circuits which have been described with respect to FIGS. 4-7 and as shown in FIGS. 17, 18, 19 and 20.

In such an arrangement the protective device 180 of FIG. 16 is similar to that described with respect to FIGS. 8 and 9. For example, the protective device 180 may have a first, second and third regions 52, 54 and 56, where the third region 56 may be modified to create the modified functionality as described above. The modified structure of this embodiment of the protective device is shown in greater detail in FIG. 21a. In another embodiment, FIG. 22 shows the cross section of the entire protective device 180 in order to show the similarities with protection device 50 described earlier with respect to FIG. 8-15.

Figure 21A:
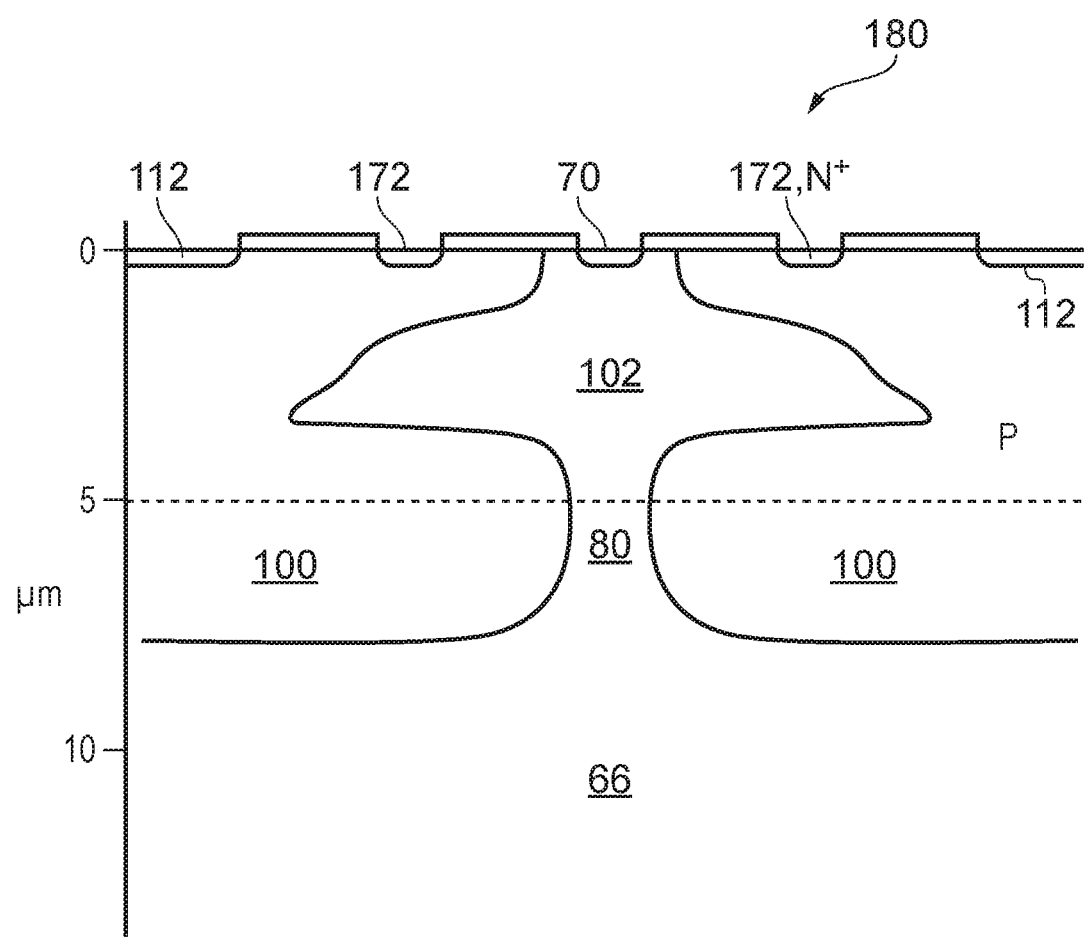
FIG. 21a is a cross-section of a portion of the device shown in FIG. 16.
Figure 21B:
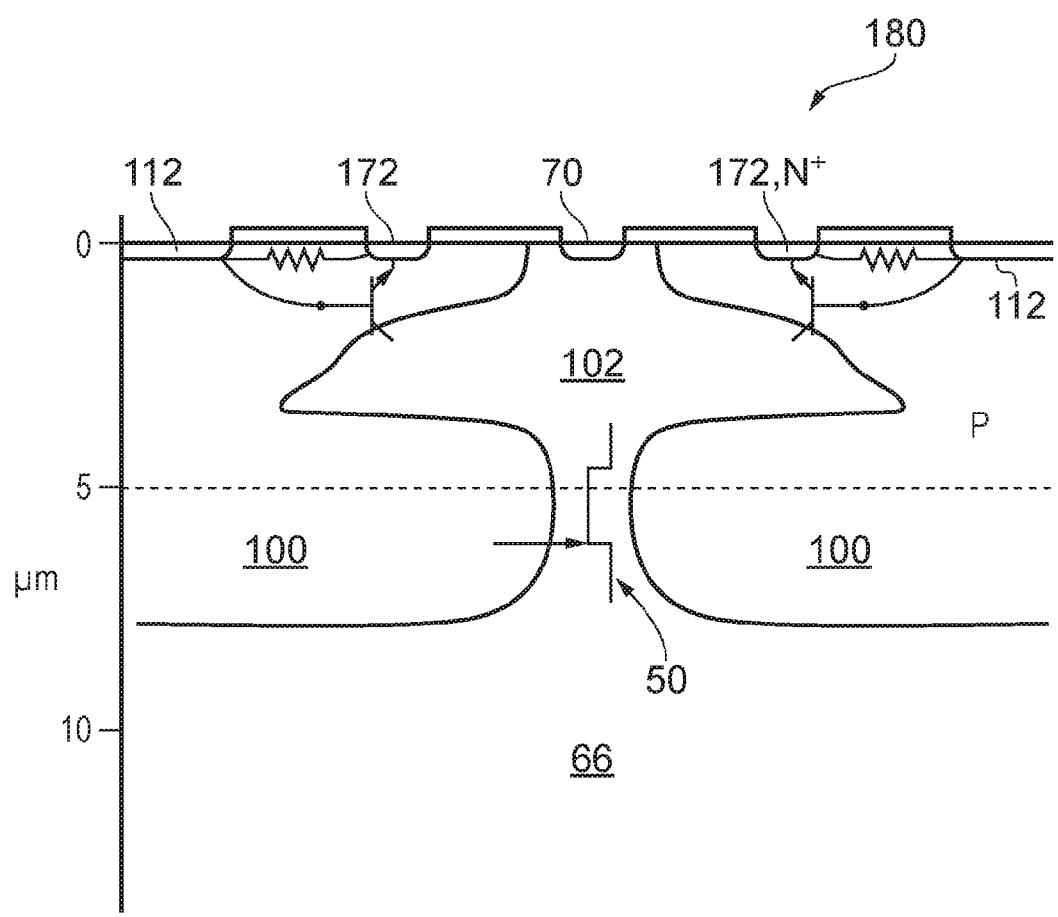
Figure 22:
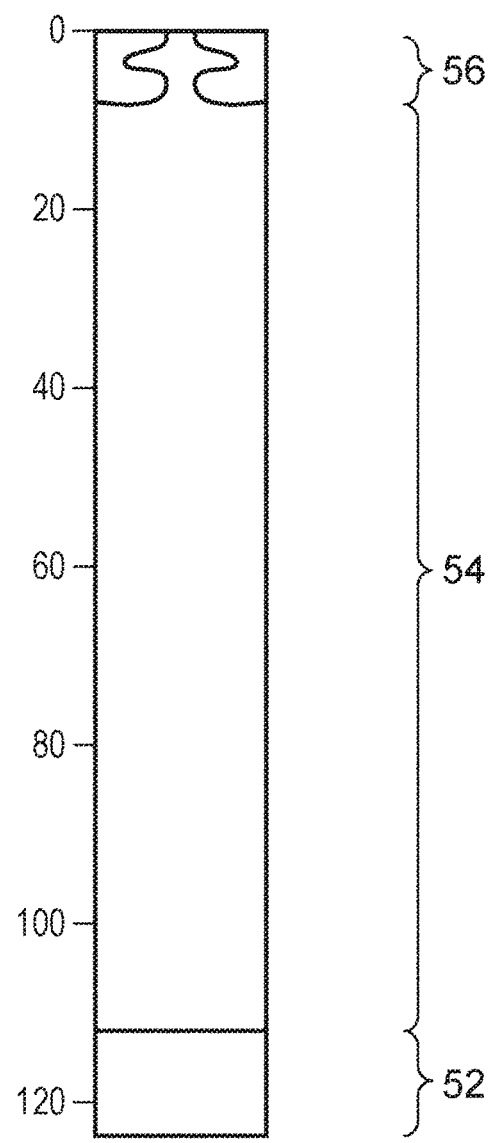
FIG. 22 is a cross-section of the vertical extent of the device shown in FIG. 16.

Referring to FIG. 21a, the structure shown therein is, in this example, based on the arrangement described with respect to FIG. 11. FIGS. 21a and 21b include a numerical scale ranging from zero to 10 microns, however it will be understood that the elements illustrated in FIGS. 21a and 21b are not necessarily drawn to scale and the numerical scale is shown for illustrative purposes only. For diagrammatic simplicity no metal connections are shown in FIG. 21a or 21b. For convenience, like numbering will be used to refer to like parts. The bipolar transistor 170 (e.g., an NPN transistor) as illustrated in the equivalent circuit of FIG. 16 may have a base connected to the gate of the JFET 24. Thus, regions 100, which may be equivalent to regions 100-1 to 100-3, may act both as the gate of the JFET 24 and the base of the bipolar transistor 170. It can also be seen that the collector of the bipolar transistor 170 is connected to the source of the JFET 24. Thus, region 102 can act as the collector of the bipolar transistor 170 and as part of the source of the JFET 24. Thus the only new component that needs to be formed is the emitter of the bipolar transistor 170. The emitter is provided by a further relatively highly doped N type region 172 in the surface of the protective device 180 and this can be formed at approximately the same time as forming the source region 70. In some embodiments, the region 102 is formed at a depth from the upper surface 93 to about 5 microns, the channel region 80 is formed at a depth of centered at approximately 5 microns, and the semiconductor 66 may be formed at a depth between about 5 microns and 10 microns. Other dimensions are possible without varying the principles and advantages of the embodiments of the protection devices disclosed herein. The position of components illustrated in FIG. 16 within the protective device 180 illustrated in FIG. 21a is shown in FIG. 21b.

FIG. 21a also illustrates that a base-emitter resistor 175 may extend between the base and emitter of the bipolar transistor 170. This could be provided as a real device attached between the emitter and base regions, or, alternatively, the resistance within the silicon P type region 100, and specifically between the doping 172 and the contacts doping 112, may be exploited to form the base-emitter resistor 175. Thus, by provision of the emitter doping 172 and connecting the emitter doping to ground by way of metal contacts (not shown) connecting with the doped regions 172, the protective device 180 can be turned from blocking current flow between nodes 160 and 162 to a protective device 180 that blocks current flow between node 160 and 162 and, when in the blocking mode, opens a conductive path between node 162 and node 172 to provide further protection for devices connected to node 162.

Figure 23:
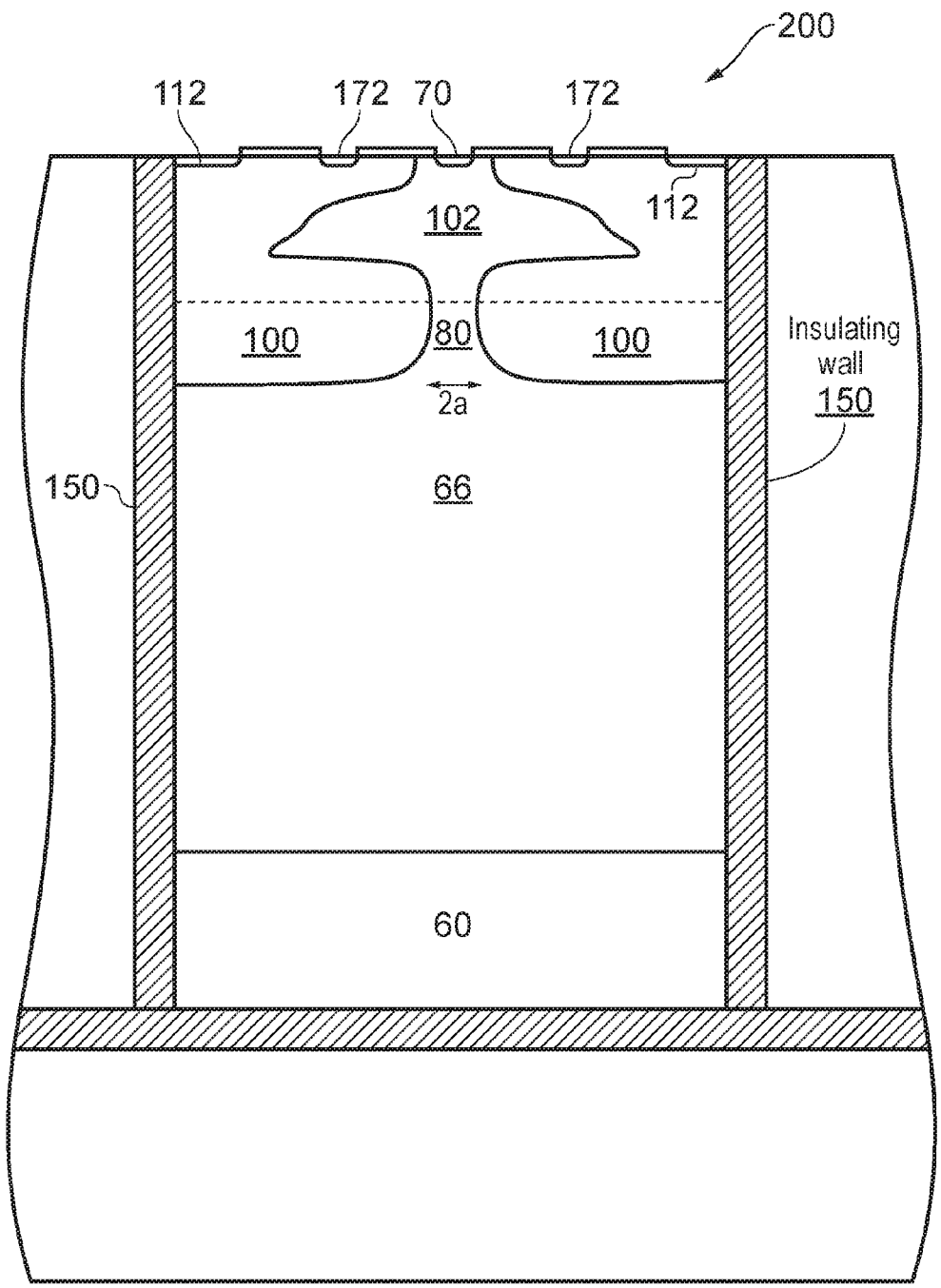
FIG. 23 is a cross-section through a further embodiment of the present disclosure.
Figure 24:
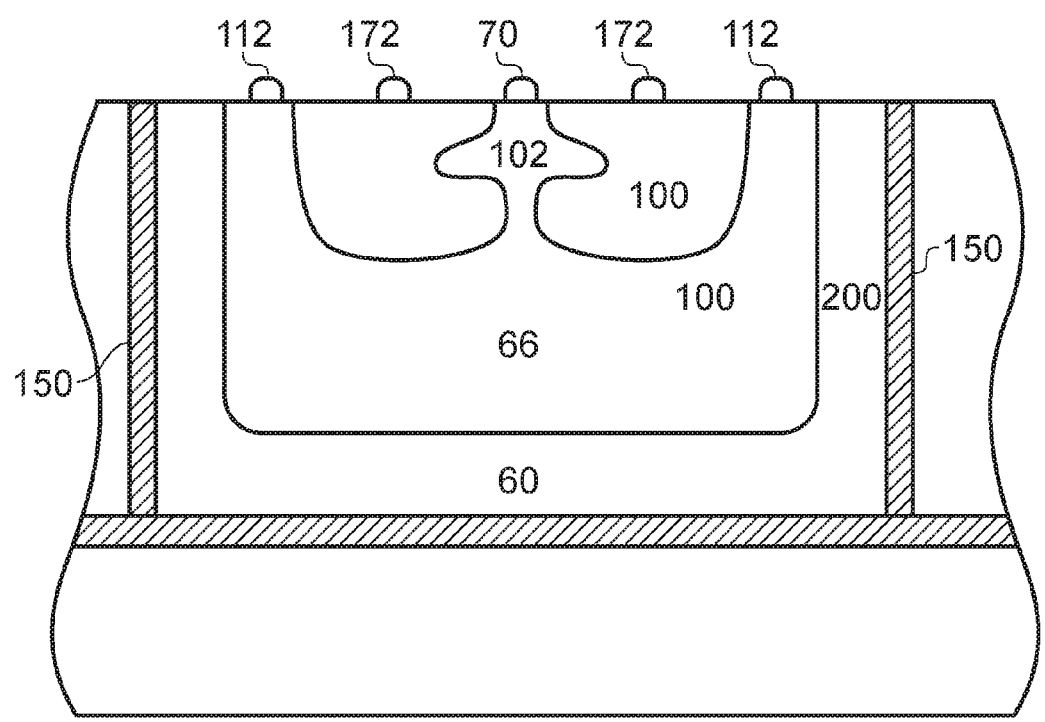
FIG. 24 is a cross-section of the device shown in FIG. 23, the cross-section being perpendicular to the plane of FIG. 23.

One non-limiting advantage, in high voltage arrangements working in excess of 1000 volts, is to form the vertical JFET such that it extends from one side of the semiconductor wafer to the other side of the semiconductor wafer. However, whilst this gives good voltage handling capability, it may introduce the inconvenience of having to make a connection to the reverse side (or back side) of the wafer. In lower voltage arrangements, this can be avoided by forming the vertical JFET (and the bipolar transistor where provided) inside an isolated well using silicon on insulator technology or a reverse biased well and then bringing the drain connection back up to the surface by way of a relatively highly doped column of the semiconductor 200 at some distance from the active region of the JFET. Such an arrangement is shown in FIGS. 23 and 24, where semiconductor 200 includes an insulating well illustrated as insulating walls 150. The insulating walls 150 can comprise any suitable dielectric material.

As described herein, the JFET is configured to become pinched off when the regions 100 forming the gate are at a pinch off voltage with respect to the channel. The pinch off voltage $V_p$ is given by:

$$V_p = \frac{eN_c(a^2)}{2\varepsilon_{si}}$$

Where Nc is the dopant concentration in the channel per m³. Nc is expressed in S.I. units and hence is a doping concentration per cubic meter. Hence a doping concentration expressed as a concentration of $1\times10^{17}$ impurities cm$^{-3}$ becomes $10^{23}$ m$^{-3}$. The channel has a nominal width of 2a hence a is half the width of the transistor (half the inter-gate distance), e is the charge on an electron, $(1.602\times10^{-19}$ coulombs) and $\varepsilon_{si}$ is the permittivity of silicon. The relative permittivity of silicon is about 11.68 and $\varepsilon_0 = 8.854\times10^{-12}$ Fm$^{-1}$.

The embodiments of the protection device described herein may also be suitable for inclusion within integrated circuits, and may be included within one or more dies within a chip scale (integrated circuit) package to provide an appropriate level of isolation and protection between integrated circuit pins operating in different voltage domains.

The isolated well structure shown in FIGS. 23 and 24 can be used with a reduced depth of the epitaxial silicon layer of semiconductor 66 to provide overvoltage protection within integrated circuits. The well structure can be used with embodiments of the protective devices described above by substituting the deep through device structure of FIG. 6 for the well structure of FIG. 23.

Figure 25:
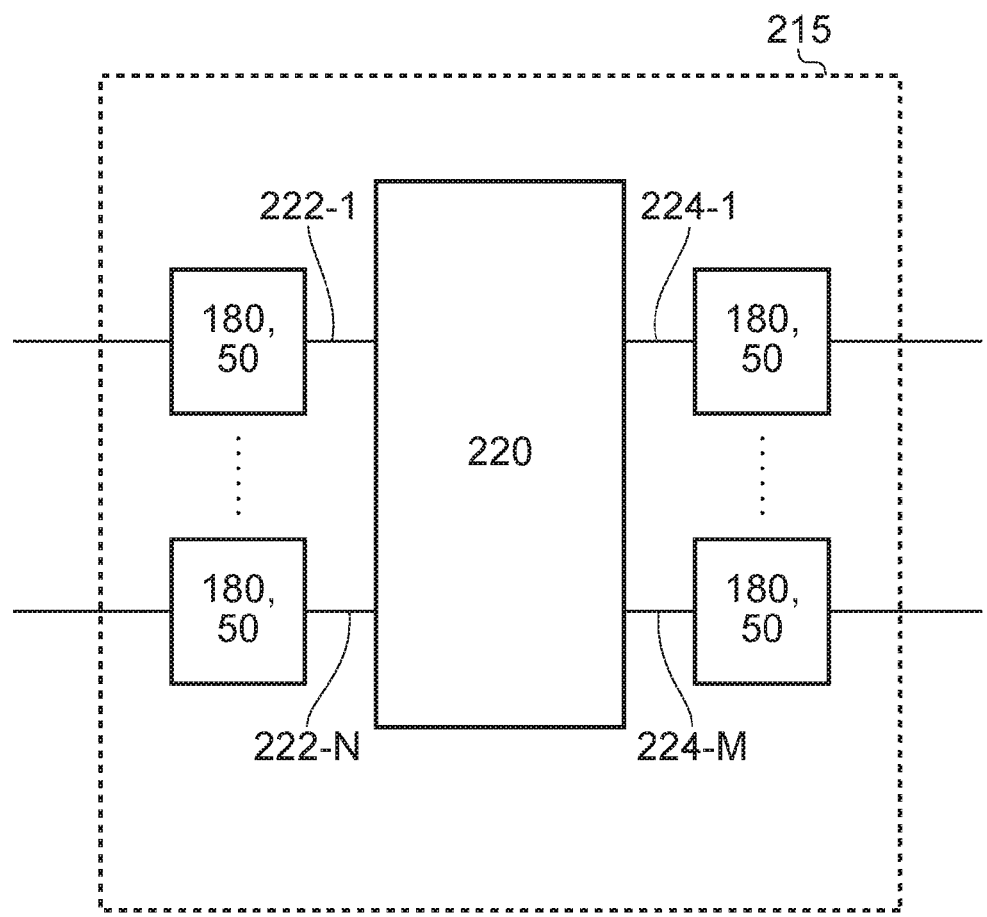
FIG. 25 schematically illustrates an integrated circuit having overvoltage protection devices associates with its inputs and outputs in accordance with the teachings of the present disclosure.

FIG. 25 schematically illustrates an integrated circuit on a die 215, where the integrated circuit comprises a core 220 which may perform a task, for example data processing, amplification, memory or any task that may be provided within an integrated circuit. The core 220 has one or more input nodes 222-1 to 222-N and one or more output nodes 222-1 to 222-M of which one or more may have a respective protection device of the type described herein (for example of the protection device 50, protective device 180, and the variations described with respect to FIGS. 8 to 16 and 21, or the shallower protective device described with respect to FIGS. 23 and 24). Accordingly, an integrated circuit may have its inputs and outputs autonomously enter a high impedance state to protect the contents of the core 220 when it experiences an overvoltage event.

Figure 26:
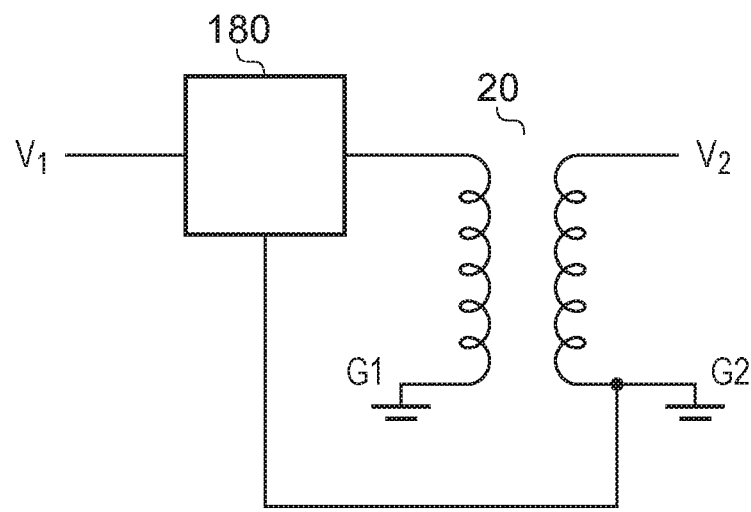
FIG. 26 schematically illustrates a further variation of a protection device and a galvanic isolator where the protection device is responsive to the voltage acting across the isolator in accordance with the teachings of the present disclosure.

In some implementations, the protection device may be more robust than a galvanic isolator and it may be possible to have the protection device span the voltage domains. For example, in a variation of the arrangement shown in FIG. 4, the gate 24G, being a control node, can be coupled to one of the nodes in the second voltage domain, while the current flow path 24D to 24S can be in the first voltage domain, as shown in FIG. 26.

Figure 27:
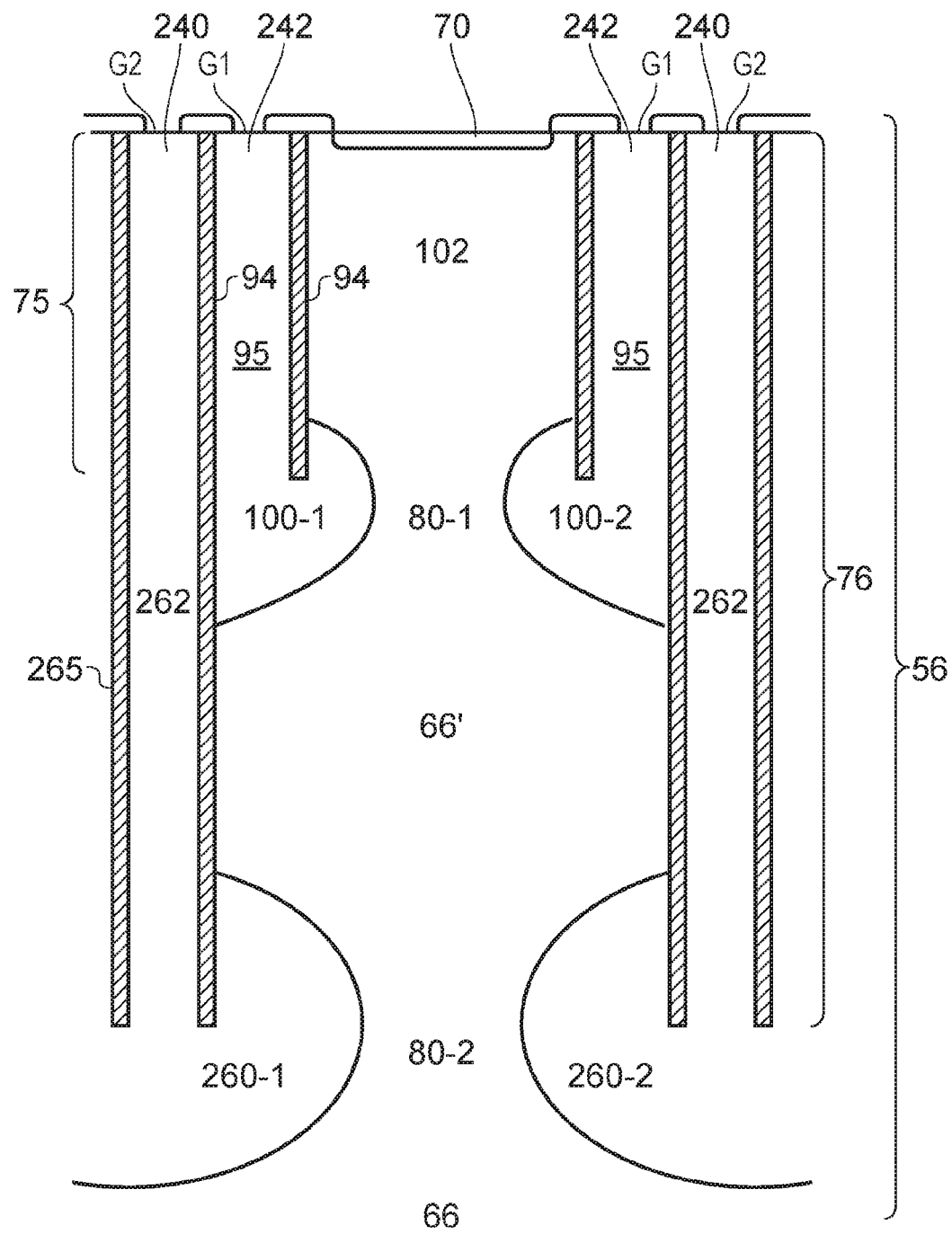
FIG. 27 schematically illustrates a modified gate structure in the third region of a protection device to provide two independent pinch off regions, each having a respective pinch off voltage.

In one embodiment, the JFET can be modified to have two channels in series, as schematically shown in FIG. 27. FIG. 27 illustrates a further variation of the third region 56 of the protection device 50. In this embodiment, the restrictive structure 75 described with respect to FIG. 9 (P type regions 100-1, 100-2 and conductors 95 bounded by insulating walls 94) is formed as previously described. However, the restrictive structure 75 may be within a second restrictive structure 76 comprising P type regions 260-1 and 260-2, being buried deeper relative to the regions 100-1 and 100-2, in contact with conductors 262 in further insulated channels formed by walls 94 and 265. This structure may form first and second series connected channels 80-1 and 80-2, each of which can pinch off autonomously at a respective pinch off voltage. One non-limiting advantage of such an arrangement is that it can be used to cause the second channel 80-2 to pinch off at, for example, a higher voltage than the first channel 80-1; to modify the electric field gradients in the vicinity of the channels 80-1 and 80-2; and to provide additional robustness against excess voltage. As a further possibility one of the gates G1 or G2 may be connected to a reference voltage (e.g., ground) to provide a protection device that goes high impedance autonomously. Similarly, the other gate (G2 or G1) may be connected to a switching signal to provide a combined switch and protection device.

Figure 28:
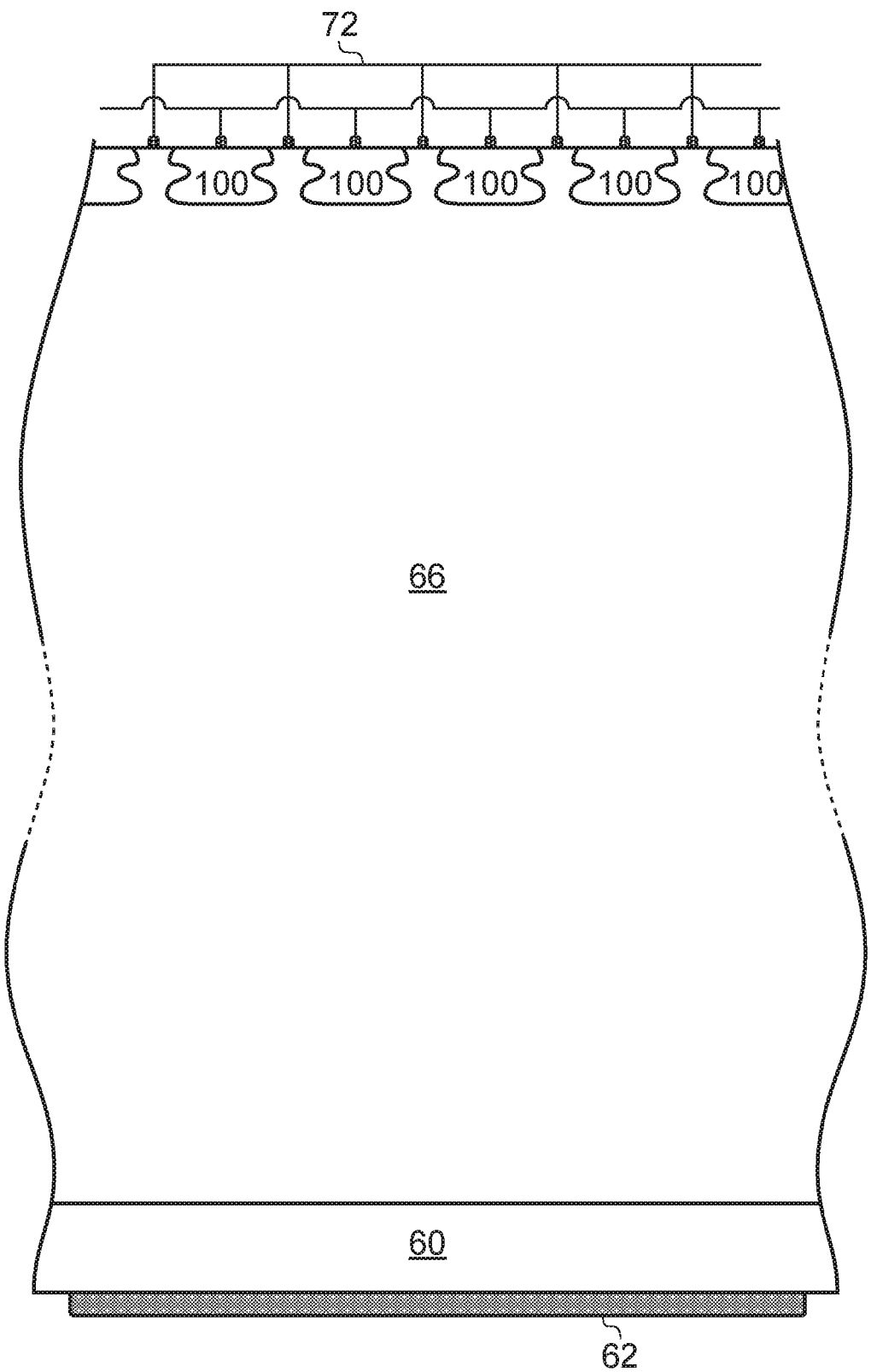
FIG. 28 is a cross section of a further embodiment of a device in accordance with the teachings of the present disclosure illustrating multiple protection devices formed in parallel to create a composite device with reduced on resistance.

In some implementations, to increase current handling capability and/or reduce the effective "on" resistance of the protection device, several protection devices can be provided side by side and share the same substrate, as illustrated in FIG. 28.

The P and N type regions can be interchanged to create other versions of functioning overvoltage protection devices. For example, protection devices in accordance with the disclosure herein may utilize PNP transistors in conjunction with a JFET.

Devices disclosed herein can be used in any field of endeavor where it is desired to provide enhanced protection between different voltage domains. Such devices may be used in the industrial domain, for example in control systems, motor drives and measurement systems to name a few non-limiting examples. Similarly such devices may also be used within the medical and domestic environments in order to provide enhanced safety between a user interface or contact to a user's body and other components within a system machine or apparatus which are exposed to higher voltages.

Aspects of this disclosure can also be implemented in various electronic devices. Examples of the electronic devices can include, but are not limited to, consumer electronic products, parts of the electronic products such as packaged switch components, electronic test equipment, cellular communications infrastructure, etc. Examples of the electronic devices can include, but are not limited to, precision instruments, medical devices, wireless devices, a mobile phone such as a smart phone, a telephone, a television, a computer monitor, a computer, a modem, a hand-held computer, a laptop computer, a tablet computer, a wearable computing device such as a smart watch, a personal digital assistant (PDA), a vehicular electronics system, a microwave, a refrigerator, a vehicular electronics system such as automotive electronics system, a stereo system, a DVD player, a CD player, a digital music player such as an MP3 player, a radio, a camcorder, a camera, a digital camera, a portable memory chip, a washer, a dryer, a washer/dryer, a wrist watch, a clock, etc. Further, the electronic devices can include unfinished products.

The claims presented herein are in single dependency format suitable for filing at the US PTO. However it is to be understood that the claims are intended to be multiply dependent on any preceding claim except where such a combination is clearly technically unfeasible.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A protection device comprising a vertically formed field effect transistor comprising a source, a drain, a gate, a semiconductor material doped to form a first type of semiconductor material in current flow communication between the source and the drain, and a restrictive structure arranged to limit a spatial extent of a conducting channel of the first type of semiconductor material based on a voltage difference between the gate and the conducting channel exceeding a pinch off voltage, wherein the restrictive structure is connected to the gate and the restrictive structure comprises a second type of semiconductor material positioned away from a surface of the protection device.

2. A protection device as claimed in claim 1, in which the restrictive structure comprises a first region and a second region of the second type of semiconductor material forming first and second buried gate regions.

3. A protection device as claimed in claim 2, wherein the restrictive structure comprises insulating walls extending from the surface of the protection device.

4. A protection device as claimed in claim 3, in which the restrictive structure comprises a conductor located between two of the insulating walls, the conductor being in physical contact with at least one of the first and second buried gate regions.

5. A protection device as claimed in claim 2, in which the restrictive structure further comprises a third region of the second type of semiconductor material extending between and connected to the first and second buried gate regions and the gate.

6. A protection device as claimed in claim 5, in which the third region surrounds a plug of the first type of semiconductor.

7. A protection device as claimed in claim 2, in which separation between the first and second buried gate regions sets the pinch-off voltage of the protection device.

8. A protection device as claimed in claim 1, in which a plug of the first type of semiconductor material extends from the source at the surface of the protection device to the conducting channel, the plug of the first type of semiconductor material is configured to be more horizontally extensive than the conducting channel.

9. A protection device as claimed in claim 8, in which the plug of the first type of semiconductor material and conducting channel are surrounded by the second type of semiconductor material.

10. A protection device as claimed in claim 1, in which the restrictive structure interacts with the first type of semiconductor material to form a junction field effect transistor, and the protection device further comprises a bipolar transistor, wherein a gate current from the junction field effect transistor provides a base current for the bipolar transistor.

11. A protection device as claimed in claim 1, further comprising an extended drain region between the first node configured to act as a drain and the conducting channel, and where a distance of a current flow path between the first node and the conducting channel is selected to set a breakdown voltage of the protection device.

12. A protection device as claimed in claim 11, wherein the protection device is formed in an insulated well and the the drain, source, and gate are on the same side of the wafer.

13. A protection device as claimed in claim 1, wherein the restrictive structure defines an extent of a plug of the first type of semiconductor material that connects the conducting channel to the source.

14. A protection device as claimed in claim 1, wherein the restrictive structure surrounds the source.

15. A protection circuit for overvoltage protection and galvanic isolation, the protection circuit comprising:
a field effect transistor comprising a source, gate, and a drain coupled to a high voltage node in a first voltage domain, the field effect transistor arranged to pinch off the a channel and inhibit current flow through the channel at a pinch off voltage based on a voltage difference between the gate and the channel exceeding the pinch off voltage; and
a galvanic isolator coupled between the source of the field effect transistor and a low voltage node in a second voltage domain; the low voltage node being associated with a lower voltage than the high voltage node.

16. The protection circuit of claim 15, wherein the field effect transistor is a vertical transistor comprising buried doped regions of an opposite conductivity type as the channel, the buried doped regions arranged to limit a spatial extent of the channel.

17. The protection circuit of claim 16, further comprising conductive material between insulating walls, the conductive material configured to provide an electrical path between a gate electrode and at least one of the buried doped regions.

18. The protection circuit of claim 15, further comprising a bipolar transistor comprising a collector coupled to the source of the field effect transistor.

19. The protection circuit of claim 15, wherein the galvanic isolation comprises one of a magnetically coupled isolator or a capacitive coupled isolator.

20. An integrated circuit comprising:
a vertical junction field effect transistor having a drain, a source in electrical communication with the drain through a channel, a gate, and a pinch off voltage, the vertical junction field effect transistor configured to block voltages received at the drain above the pinch off voltage based on the voltage difference between the gate and the channel so as to reduce a voltage at the source relative to a voltage at the drain; and
a galvanic isolator configured to receive a signal from the source of the vertical junction field effect transistor.

\* \* \* \* \*

UNITED STATES PATENT AND TRADEMARK OFFICE
CERTIFICATE OF CORRECTION

PATENT NO.        : 9,698,594 B2                                    Page 1 of 1
APPLICATION NO.   : 14/937771
DATED             : July 4, 2017
INVENTOR(S)       : Edward John Coyne It is certified that error appears in the above-identified patent and that said Letters Patent is hereby corrected as shown below:

In the Specification

In Column 2 at Line 48, change "events" to --events.--.

In Column 3 at Line 30, after "of the" delete "of a".

In the Claims

In Column 14 at Lines 47-48, in Claim 12, change "the the" to --the--.

In Column 14 at Line 60, in Claim 15, change "the a" to --a--.

In Column 14 at Line 66, in Claim 15, change "domain;" to --domain,--.

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*